United States Patent
McCallister

(10) Patent No.: US 8,909,175 B1
(45) Date of Patent: Dec. 9, 2014

(54) TRANSMITTER AND METHOD FOR RF POWER AMPLIFIER HAVING A BANDWIDTH CONTROLLED, DETROUGHED ENVELOPE TRACKING SIGNAL

(71) Applicant: CrestCom, Inc., Scottsdale, AZ (US)

(72) Inventor: Ronald Duane McCallister, Scottsdale, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 0 days.

(21) Appl. No.: 13/928,969

(22) Filed: Jun. 27, 2013

(51) Int. Cl.
*H04B 1/04* (2006.01)
*H01Q 11/12* (2006.01)
*H04L 25/08* (2006.01)

(52) U.S. Cl.
CPC ............ *H04B 1/0475* (2013.01); *H04L 25/08* (2013.01)
USPC ................... 455/114.3; 455/63.1; 455/67.13; 455/126; 455/127.1; 375/296; 375/297; 330/127; 330/297

(58) Field of Classification Search
CPC ............ H03F 2200/102; H03F 2200/435; H03F 2200/451; H03F 1/0222; H03F 1/3241; H03F 1/3247; H03F 1/025; H03F 1/32; H03F 1/0266; H03F 1/0272; H03F 1/0255; H03F 3/189; H03F 3/191; H03F 3/20; H03F 2201/3233; H04B 1/0475; H04B 1/62; H04B 1/02; H04B 15/00; H04B 2001/045; H04B 2001/0425; H03G 3/004; H03G 3/3042; H03G 2201/206; H03G 2201/307; H03G 3/20; H03G 3/3036; H04W 52/52

USPC ............ 455/63.1, 67.13, 114.1, 114.2, 114.3, 455/115.1, 126, 127.1, 127.2; 375/296, 375/297; 330/127, 129, 149, 297
See application file for complete search history.

(56) References Cited

U.S. PATENT DOCUMENTS

| | | | | |
|---|---|---|---|---|
| 6,157,253 | A * | 12/2000 | Sigmon et al. | 330/10 |
| 7,339,426 | B2 * | 3/2008 | Gurvich et al. | 330/297 |
| 7,539,466 | B2 * | 5/2009 | Tan et al. | 455/127.1 |
| 7,570,931 | B2 | 8/2009 | McCallister et al. | |
| 7,634,240 | B2 * | 12/2009 | Mitzlaff et al. | 455/127.3 |
| 7,706,467 | B2 * | 4/2010 | Kenington | 375/296 |

(Continued)

OTHER PUBLICATIONS

P. Asbeck et al., "Efficiency and Linearity Improvement in Power Amplifiers for Wireless Communications" pp. 1-4, 1998, University of California, San Diego, La Jolla, CA.

(Continued)

*Primary Examiner* — Quochien B Vuong
(74) *Attorney, Agent, or Firm* — Schmeiser, Olsen & Watts LLP; Lowell W. Gresham

(57) ABSTRACT

A transmitter (70) generates a time-varying, detroughed, biasing signal (154) for an RF power amplifier (10) so that the RF power amplifier (10) is biased in accordance with an envelope tracking scheme. A trough-filling section (94) is responsive to an envelope tracking signal (86), which in turn is responsive to a magnitude signal (90) extracted from a complex baseband communication signal (76). The trough-filing section (94) includes a limiting stage (108) that forms a raw troughing signal (110) which expands the bandwidth of the envelope tracking signal (86). A filtering stage (116) reduces the bandwidth of the raw troughing signal (110) to form a trough-filling signal (122) that is combined back into the envelope tracking signal (86) using a linear process that maintains the bandwidth of the envelope tracking signal (86).

28 Claims, 10 Drawing Sheets

(56) References Cited

U.S. PATENT DOCUMENTS

| | | | |
|---|---|---|---|
| 7,783,260 | B2 | 8/2010 | McCallister et al. |
| 8,093,946 | B2 | 1/2012 | Wimpenny et al. |
| 8,159,295 | B2 * | 4/2012 | Asbeck et al. .............. 330/297 |
| 8,718,579 | B2 * | 5/2014 | Drogi .............. 455/126 |
| 2004/0266369 | A1 | 12/2004 | McCallister |
| 2012/0106676 | A1 | 5/2012 | McCallister et al. |

OTHER PUBLICATIONS

Jinsung Choi et al., "A Polar Transmitter With CMOS Programmable Hysteretic-Controlled Hybrid Switching Supply Modulator for Multistandard Applications" IEEE Transactions on Microwave Theory and Techniques, vol. 57, No. 7, Jul. 2009, pp. 1675-1686, Korea.

Christian Fager et al., "A Comprehensive Analysis of IMD Behavior in RF CMOS Power Amplifiers" IEEE Journal of Solid-State Circuits, vol. 39, No. 1, Jan. 2004, pp. 24-34.

Gary Hanington et al., "High-Efficiency Power Amplifier Using Dynamic Power-Supply Voltage for CDMA Applications" IEEE Transactions on Microwave Theory and Techniques, vol. 47, No. 8, Aug. 1999, pp. 1471-1476.

Muhammad Hassan et al., "A Wideband CMOS/GaAs HBT Envelope Tracking Power Amplifier for 4G LTE Mobile Terminal Applications" IEEE Transactions on Microwave Theory and Techniques, vol. 60, No. 5, May 2012, pp. 1321-1330.

Jinseong Jeong et al., "Envelope Tracking Power Amplifiers with Reduced Peak-to-Average Power Ratio RF Input Signals" IEEE RWS, 2010, pp. 112-115, California, USA.

Jinseong Jeong et al., "High-Efficiency WCDMA Envelope Tracking Base-Station Amplifier Implemented With GaAs HVHBTs" IEEE Journal of Solid-State Circuits, vol. 44, No. 10, Oct. 2009, pp. 2629-2639, USA.

Jinseong Jeong et al., "Modeling and Design of RF Amplifiers for Envelope Tracking WCDMA Base-Station Applications" IEEE Transactions on Microwave Theory and Techniques, vol. 57, No. 9, Sep. 2009, pp. 2148-2159.

Jinsoeng Joeng et al., "Wideband Envelope Tracking Power Amplifiers With Reduced Bandwidth Power Supply Waveforms and Adaptive Digital Predistortion Techniques" IEEE Transactions on Microwave Theory and Techniques, vol. 57, No. 12, Dec. 2009, pp. 3307-3314, California, USA.

Ildu Kim et al., "High-Efficiency Hybrid EER Transmitter Using Optimized Power Amplifier" IEEE Transactions on Microwave Theory and Techniques, vol. 56, No. 11, Nov. 2008, pp. 2582-2593, Korea.

Dongsu Kim et al., "Optimization for Envelope Shaped Operation of Envelope Tracking Power Amplifier" IEEE Transactions on Microwave Theory and Techniques, vol. 59, No. 7, Jul. 2011, pp. 1787-1795.

Ildu Kim et al., "Optimized Envelope Shaping for Hybrid EER Transmitter of Mobile WiMAX—Optimized ET Operation" IEEE Microwave and Wireless Components Letters, vol. 19, No. 5, May 2009, pp. 335-337, Korea.

Jose Carlos Pedro et al., "Nonlinear Distortion Analysis of Polar Transmitters" IEEE Transactions on Microwave Theory and Techniques, vol. 55, No. 12, Dec. 2007, pp. 2757-2765, Spain.

Kiyohiko Takahashi et al., "An Envelope Tracking Power Amplifier Using an Adaptive Biased Envelope Amplifier for WCDMA Handsets" IEEE Radio Frequency Integrated Circuits Symposium 2008, pp. 405-408, Japan.

* cited by examiner

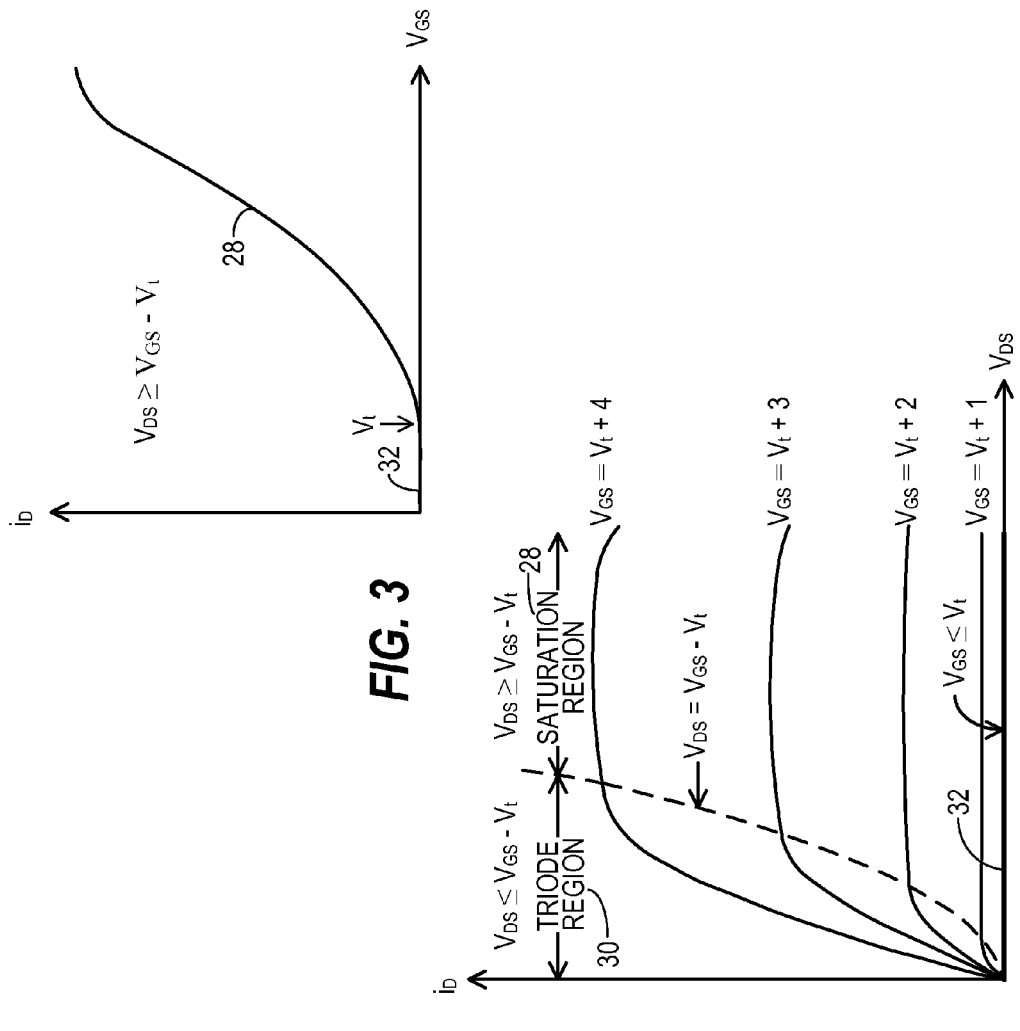
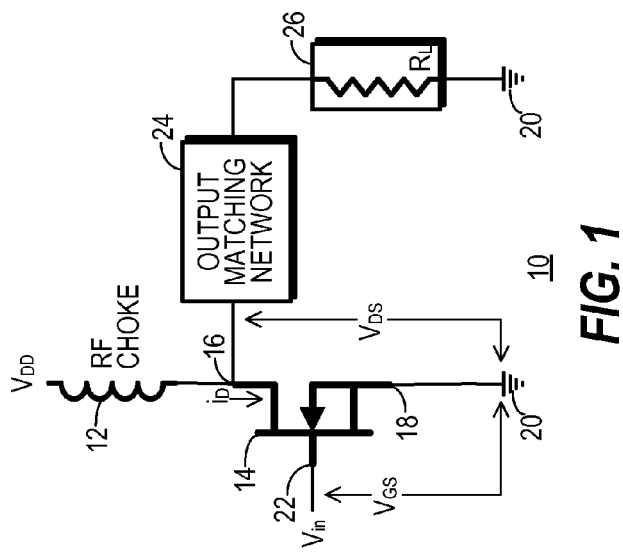
FIG. 1
FIG. 2
FIG. 3

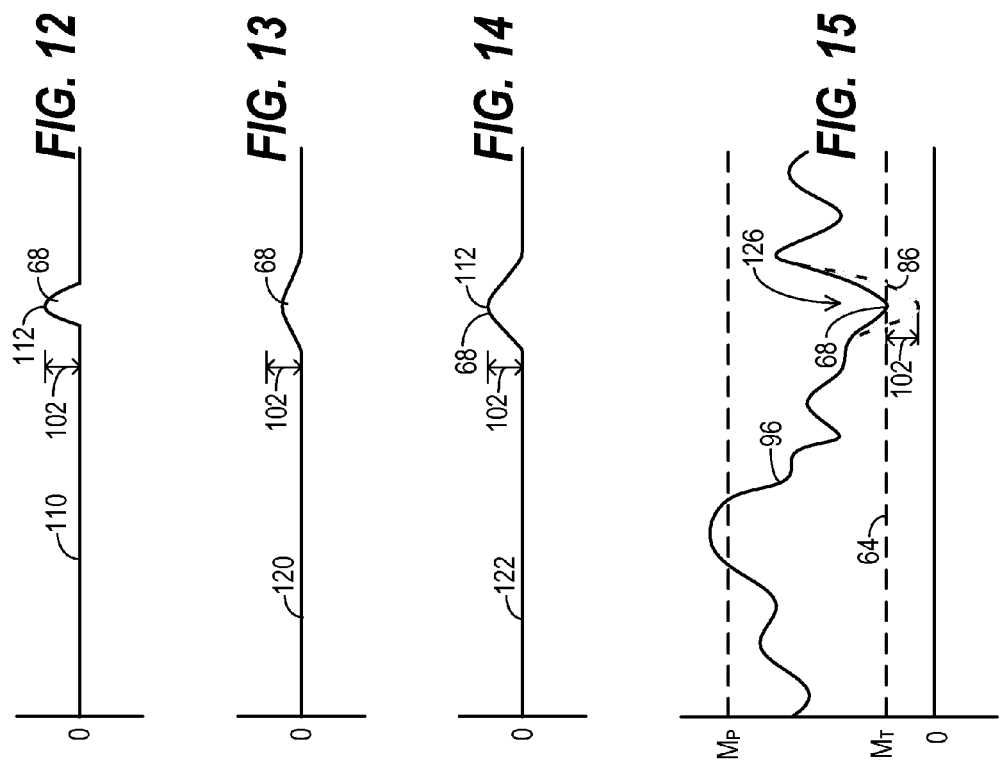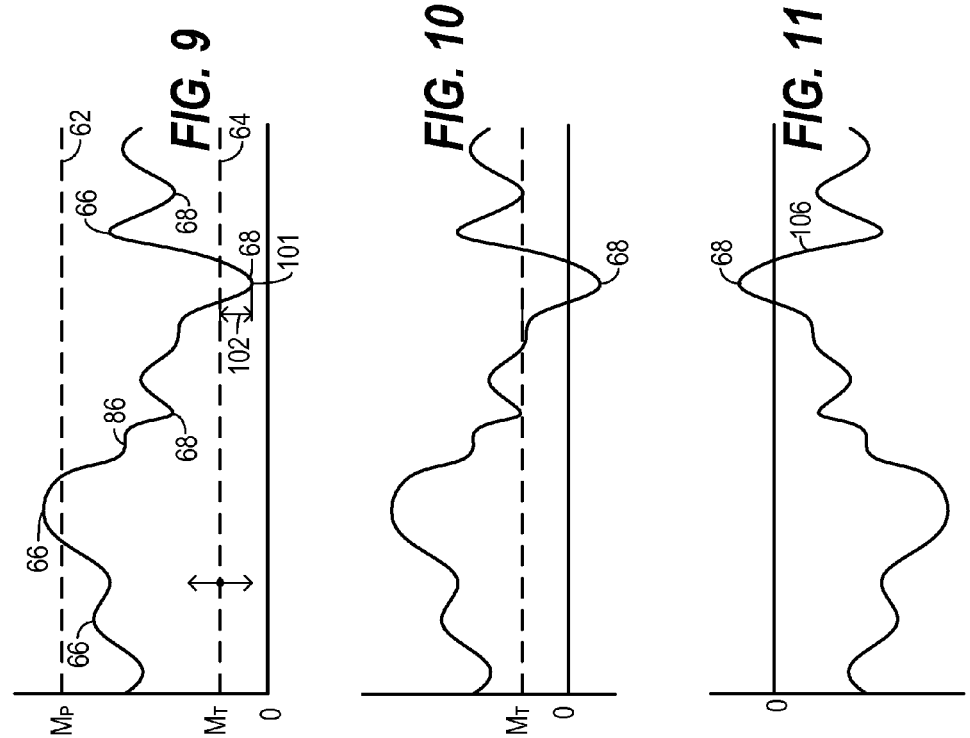

TRANSMITTER AND METHOD FOR RF POWER AMPLIFIER HAVING A BANDWIDTH CONTROLLED, DETROUGHED ENVELOPE TRACKING SIGNAL

TECHNICAL FIELD OF THE INVENTION

The present invention relates generally to the field of radio-frequency (RF) communication systems. Specifically, the present invention relates to RF transmitters that generate and use RF power amplifier biasing signals which track the RF communication signal envelope to improve power added efficiency and which employ envelope waveform shaping to prevent gain collapse in the RF power amplifier.

BACKGROUND OF THE INVENTION

An RF power amplifier provides the final stage of amplification for a communication signal that has been modulated and converted into an RF signal. Often that RF signal exhibits frequencies in a predetermined frequency band that is licensed by a regulatory agency for a particular use. The RF power amplifier boosts the power of this RF communication signal to a level sufficient so that the signal, when it propagates to an antenna, will be broadcast in such a manner that it will meet the communication goals of the RF transmitter.

Many popular modern modulation techniques, such as CDMA, QAM, OFDM, and the like, require the RF power amplifier to perform a linear amplification operation. In other words, the RF communication signal conveys both amplitude and phase information, and the RF power amplifier should faithfully reproduce both the amplitude and phase content of the RF signal presented to it. While perfect linearity is a goal for any linear RF power amplifier, all linear RF power amplifiers invariably fail to meet it. The degree to which the goal of perfect linearity is missed leads to unwanted intermodulation, nonlinearities, and spectral regrowth.

The regulatory agencies that license RF spectrum for use by RF transmitters define spectral masks with which transmitters should comply. The spectral masks set forth how much RF energy may be transmitted from the RF transmitters in specified frequency bands of the electromagnetic spectrum. As transmitter technology has advanced, and as increasing demands have been placed on the scarce resource of the RF electromagnetic spectrum by the public, the spectral masks have become increasingly strict. In other words, very little energy outside of an assigned frequency band is permitted to be transmitted from an RF transmitter. Accordingly, unless the spectral regrowth that results from any nonlinearity in the amplification process is held to a very low level, the RF transmitter may be in violation of its regulatory spectral mask. Spectral masks for lower power, unlicensed bands of the spectrum tend to be more lenient than for higher power, licensed-band RF transmitter applications.

In addition to linearity requirements set through spectral masks, power-added efficiency (PAE) is another parameter of interest to those who design RF transmitters. PAE is the ratio of the RF output power to the sum of the input RF power and the applied bias-signal power. An amplifier that has low PAE wastes power, which is undesirable in any transmitter, but particularly undesirable in battery-powered transmitters because it necessitates the use of undesirably large batteries and/or undesirably frequent recharges. Conventionally, improvements in PAE have been achieved at the expense of linearity. But envelopes tracking (ET) techniques, envelope elimination and restoration (EER) techniques, and hybrids between the two techniques have shown promise for achieving PAE improvements. When such techniques are combined with conventional digital predistortion techniques, the RF power amplifiers may also achieve modest amounts of linearity.

Envelope tracking (ET) refers to a general technique for biasing an RF power amplifier using a time-varying signal that at least roughly tracks the envelope of the RF communication signal. In accordance with ET techniques, a full RF communication signal exhibiting both amplitude and phase modulation is supplied to an input of the RF power amplifier, and the RF power amplifier is configured to perform substantially linear amplification. When the amplifying device at the core of the RF power amplifier is operated exclusively in its saturation region, its gain is less sensitive to fluctuations across its drain/collector and source/emitter terminals. When a bias signal applied to this amplifying device tracks the envelope and is maintained at a level no greater than it needs to be to maintain operation in the device's saturation region, the device generally operates as a somewhat linear amplifier and wastes less power than it would using a constant bias signal.

Envelope elimination and restoration (EER) may be viewed as a specialized form of ET. In accordance with EER, a biasing signal applied to the amplifying device at the core of the RF power amplifier should identically reproduce the envelope of the RF communication signal. Since this biasing signal essentially is the envelope, the envelope may be eliminated from the RF communication signal before an RF signal is applied to the input of the RF power amplifier. This applied RF signal is only angle or polar modulated and not amplitude modulated. Consequently, the core amplifying device may be operated as an inherently more efficient switching amplifier. Amplitude modulation is restored to the angle or polar modulated RF signal at the output of the core amplifying device through the envelope tracking biasing signal.

Hybrid techniques represent a combination of the more generic ET and more specific EER techniques. In particular, the core amplifying device of the RF power amplifier is typically configured for substantially linear operation, and the core device is biased using a signal that closely tracks the envelope of the RF communication signal. Such hybrid techniques can achieve substantial improvements in PAE compared to other linear amplifiers, but in order to maintain modest amounts of linearity, other compensating techniques in additional to conventional digital predistortion are required.

In particular, using field effect transistor (FET) amplifier nomenclature, in order to minimize amplifier nonlinearity it is desirable to operate a substantially linear amplifier so that $V_{DS} \geq V_{GS} - V_T$, where $V_{DS}$ is the drain-source voltage, $V_{GS}$ is the gate-source voltage, and $V_T$ is a threshold associated with a gate-to-source voltage below which the drain-to-source current is zero. The threshold voltage $V_T$ is roughly the $V_{GS}$ voltage where the core amplifying device begins to conduct. By maintaining $V_{DS} \geq V_{GS} - V_T$, the core amplifying device remains in its saturation region where substantially linear amplification may result. Due to filtering circuits which typically surround the core amplifying device, the RF power amplifier may experience brief instants less than the duration of a complete cycle of the RF waveform where $V_{DS} < V_{GS} - V_T$. But prolonged durations greater than a complete cycle of the RF waveform with $V_{DS} < V_{GS} - V_T$ lead to significant nonlinearity in the operation of the RF power amplifier and to spectral mask violations.

Conventional digital predistortion techniques may compensate for some nonlinearities that result from signal anomalies occurring on a baseband or video band time scale. Conventional digital predistortion techniques apply a predistorting gain to the digital baseband communication signal upstream of amplification to compensate for amplifier gain fluctuations that are experienced over a duration of many RF waveform cycles. This duration reflects the baseband or video band time scale. When an RF power amplifier operates in a $V_{DS}<V_{GS}-V_T$ condition for an extended period of time, the amplifier is likely to be applying a gain of zero and/or a gain that is highly dependent upon instantaneous values of $V_{DS}$ for the extended period of time. Conventional digital predistortion techniques are unable to adequately compensate for such gain fluctuations. For example, when the amplifier applies a gain of zero, the predistortion would need to provide an infinite gain to compensate. The RF power amplifier will apply a gain of zero whenever $V_{GS}<V_T$. Such operation is referred to as gain collapse. Providing infinite predistortion gain to compensate for gain collapse is not achievable using realistic components.

When an RF power amplifier is being operated as an ET, EER, or hybrid amplifier, a biasing signal that closely tracks the RF communication signal envelope may occasionally exhibit very low levels in the baseband or video signal time scale, even corresponding to where $V_{GS}<V_T$, because the envelope occasionally exhibits such low levels. In accordance with the field effect transistor (FET) example, when this happens, an ET biasing signal that leads to high levels of PAE may cause $V_{DS}$ to exhibit very low levels, and the RF power amplifier operates in the $V_{DS}<V_{GS}-V_T$ condition for an extended period of time. Moreover, conventional digital predistortion techniques are powerless to compensate for the resulting significant nonlinearity and spectral regrowth that occur. Consequently, RF transmitters with RF power amplifiers operated as ET, EER, or hybrid amplifiers employ waveform shaping in addition to digital predistortion to prevent operation in the $V_{DS}<V_{GS}-V_T$ condition and to promote operation in the $V_{DS}\geq V_{GS}-V_T$ condition for all extended periods of time. Such waveform shaping techniques are also known as detroughing because the troughs of the envelope signal are boosted or filled prior to being used to bias the RF power amplifier at levels that promote operation in the $V_{DS}\geq V_{GS}-V_T$ condition.

Conventional detroughing techniques utilize an instantaneous mapping process performed at baseband to detrough the envelope signal. Typically, a magnitude signal is formed from a communication signal. The magnitude signal describes the envelope of the RF communication signal to be amplified. When the magnitude level over a period equivalent to many RF waveform cycles is low, the magnitude is boosted. The minimum period over which the envelope waveform is shaped is determined by a sampling rate for digital circuits which perform predistortion and waveform shaping. In one example, the detroughed magnitude is instantly boosted to a predetermined level when the magnitude signal is below a threshold, and the detroughed magnitude otherwise equals the magnitude signal. For this example, a small amount of amplifier linearity is restored without substantially harming PAE. In other examples, the detroughed magnitude is instantly boosted by a predetermined amount that varies with the precise value of the magnitude signal. Greater amounts of boost are used for lower magnitudes and smaller amounts are used for higher magnitudes. For these examples, somewhat better amplifier linearity is restored without substantially harming PAE.

Unfortunately, the conventional detroughing techniques merely tend to replace greater amounts of nonlinearity resulting from one characteristic of RF power amplifier operation with lesser amounts of nonlinearity resulting from another characteristic of RF power amplifier operation. As a result, conventional RF power amplifiers which employ ET and waveform shaping tend to achieve only modest linearity with significant PAE improvements.

What is needed is an RF transmitter having an RF power amplifier that achieves significant PAE improvements with linearity improved over the linearity achievable using conventional detroughing techniques.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a simplified block diagram of a generic form of an RF power amplifier;

FIG. 2 shows a chart depicting representative transfer characteristics of the amplifier of FIG. 1;

FIG. 3 shows a representative chart depicting the manner in which an output current $i_D$ may vary as a function of an input voltage $V_{GS}$ in the amplifier of FIG. 1 when in a saturation region of operation;

FIGS. 9-15 show signal charts depicting a series of processing stages applied to a deeper-trough envelope tracking signal in the trough-filling section of FIG. 8;

DETAILED DESCRIPTION OF THE PREFERRED EMBODIMENTS

Figure 4:
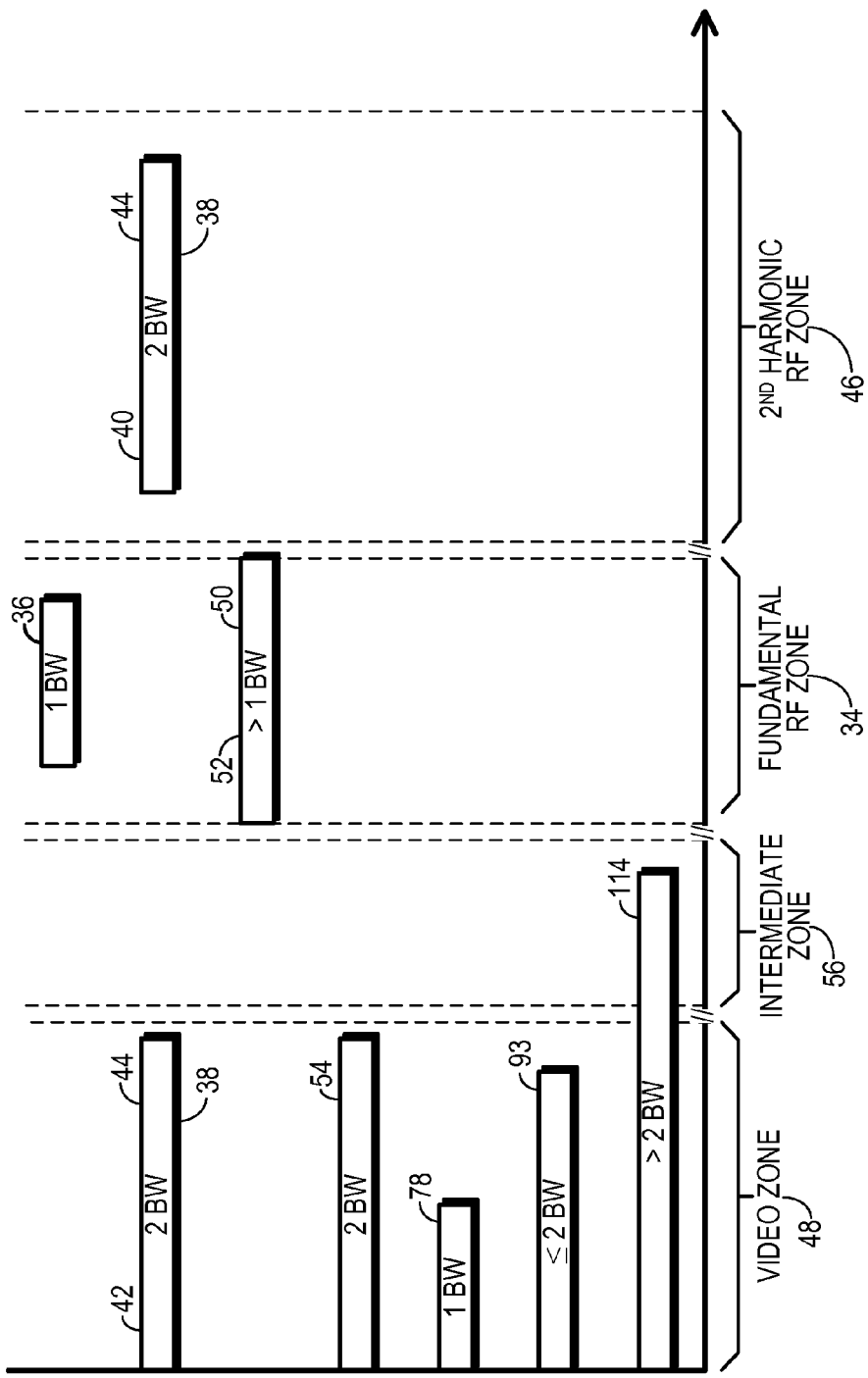
FIG. 4 shows a chart of four different zones of the electromagnetic spectrum and of relative bandwidths of signals discussed in connection with FIGS. 1-20.

FIG. 1 shows a simplified block diagram of a generic form of an RF power amplifier 10. A biasing signal $V_{DD}$ is applied through an RF choke inductor 12 to an output of a core amplifying device 14, represented in FIG. 1 using a field effect transistor (FET) symbol. The biasing signal is shown as being applied to a drain 16 of device 14. Those skilled in the art will appreciate that a wide variety of FET amplifying devices, including MOS, CMOS, LDMOS, and the like may be used as amplifying device 14 and that other types of transistor and tube forms of amplifying devices 14 may also be used. Moreover, while FIG. 1 shows only a single amplifying device 14 for simplicity, RF power amplifier 10 may use multiple active devices coupled together to serve in the role of amplifying device 14. Examples of such multiple-device structures include a push-pull configuration commonly used for class AB operation and a stack commonly used with CMOS amplifying devices.

A source 18 of amplifying device 14 couples to a terminal 20 adapted to provide a ground potential. A gate 22 serves as an input for core amplifying device 14 and drain 16 serves as the output for device 14. An output matching network 24 couples between drain 16 and a load 26. FIG. 1 depicts load 26 as a restive load $R_L$, for simplicity, and shows load 26 being coupled between output matching network 24 and ground 20. For a FET version of core amplifying device 14, the input signal is typically expressed as a voltage $V_{GS}$ relative to ground. FET versions of core amplifying device 14 are typically viewed as being transconductance devices, so the output is often referred to as the current which flows through drain 16 and source 18. But the voltage $V_{DS}$ across drain 16 and source 18 is an important parameter as well for purposes of biasing and linearizing amplifying device 14. Those skilled in the art will appreciate that RF power amplifier 10 need not follow the simplified architecture depicted in FIG. 1 but that a wide variety of conventional and unconventional RF power amplification architectures may alternatively be used.

FIG. 2 shows a chart depicting representative transfer characteristics of core amplifying device 14. Those skilled in the art will appreciate that FIG. 2 shows only general transfer characteristics and that different types of amplifying devices 14 may be represented by different curves. In general, FIG. 2 shows that amplifying device 14 has three different operational regions, each of which has vastly different characteristics. In a saturation region 28, output $i_D$ is mostly responsive to input $V_{GS}$, and only slightly responsive to $V_{DS}$. Saturation region 28 is the substantially linear region of operation and the region where amplifying device 14 should operate for a substantial portion of each RF waveform cycle for improved linearity.

A triode region 30 represents a region that amplifying device 14 should avoid when linearity and high PAE are the goals. In triode region 30, output $i_D$ is substantially influenced by both $V_{GS}$ and $V_{DS}$. A cutoff region 32 is represented in FIG. 2 by the horizontal axis, where output $i_D$ equals zero. In cutoff region 32, amplifying device 14 is not conducting or otherwise amplifying input $V_{GS}$. Class B and class AB amplifier configurations may achieve respectable PAE results and respectably linear results by having an amplifying device 14 spend significant time operating in cutoff region 32. For the class AB example, an additional and complementary amplifying device (not shown) is typically operating in its saturation region 28 when amplifying device 14 operates in its cutoff region 32, and vice versa.

FIG. 3 shows a representative chart depicting the manner in which output current $i_D$ may vary as a function of an input voltage $V_{GS}$ when amplifying device 14 operates in its cutoff region 32 and its saturation region 28. In particular, FIG. 3 shows that until input voltage $V_{GS}$ exceeds a threshold voltage $V_T$, output $i_D$ remains at zero. This condition represents cutoff region 32. Then, as input voltage $V_{GS}$ exceeds the threshold voltage $V_T$, output $i_D$ increases nonlinearly as a function of $V_{GS}$. In particular, $i_D$ exhibits a strong square-law dependence on $V_{GS}$ in addition to a linear dependence on the difference between $V_{GS}$ and $V_T$. Operation in saturation region 28 is maintained by maintaining $V_{DS} \geq V_{GS} - V_T$ and $V_{GS} > V_T$.

FIG. 4 shows a chart of four different zones of the electromagnetic spectrum and of relative bandwidths of signals discussed in connection with FIGS. 1-20. A fundamental RF zone 34 represents one of these four zones. Fundamental RF zone 34 is the portion of the electromagnetic spectrum where a transmitter that employs amplifying device 14 (FIG. 1) is designed and/or authorized to operate. The transmitter may transmit at a full authorized power within and throughout a single bandwidth 36 located in fundamental RF zone 34. For purposes of this discussion, bandwidth 36 represents the difference between the highest and lowest frequencies in the range of frequencies within which the transmitter is designed and/or authorized to operate. Thus, bandwidth 36 and other bandwidths discussed below may be associated with signals that appear in fundamental RF band 34 and also in other zones of the electromagnetic spectrum.

Referring to FIGS. 1-4, each cycle of the RF waveform for the input signal $V_{GS}$ and output signal $i_D$ is carried out in a period of time inversely proportional to a frequency that falls within bandwidth 36 at fundamental RF zone 34. But the nonlinear nature of the transfer characteristic depicted in FIG. 3 and other nonlinear characteristics depicted in FIG. 2 cause amplifying device 14 to generate harmonic components of the energy positioned in bandwidth 36 at fundamental RF zone 34. The most prominent of these harmonic components is a second order harmonic 38. Second order harmonic 38 has an upper sideband 40 and lower sideband 42, each of which roughly occupies a double bandwidth 44 twice the span of bandwidth 36. Upper sideband 40 is positioned in a second harmonic RF zone 46 of the electromagnetic spectrum, located at twice the frequency of fundamental RF zone 34. Lower sideband 42 is positioned in the portion of the electromagnetic spectrum immediately above DC, referred to herein as video zone 48.

Desirably, components of output signal $i_D$ falling outside of fundamental RF zone 34 are substantially prevented from being broadcast from the transmitter. A conventionally designed output matching network 24 and load 26 that act as a band pass filter tuned to fundamental RF zone 34 is generally effective in blocking upper and lower sidebands 40 and 42. But lower sideband 42, also referred herein as a video signal 42, poses an indirect problem that is more challenging to address.

In particular, video signal 42 causes $V_{DS}$ to exhibit fluctuations in video zone 48. While RF amplifying device 14 is to a large degree insensitive to fluctuations in $V_{DS}$ when RF amplifying device 14 operates in its saturation region 28, it is not completely insensitive to such fluctuations. In other words, while RF amplifying device 14 may be understood to be a linear amplifier, it is imperfectly linear. Consequently, the transconductance or gain of RF amplifying device 14 experiences video zone 48 fluctuations, and such fluctuations intermodulate with the fundamental RF zone 34 input signal $V_{GS}$ to produce one form of distortion 50. Distortion 50 is unwanted because it decreases signal-to-noise ratio (SNR) of the signal broadcast from the transmitter. But distortion 50 is particularly unwanted because it exhibits an expanded bandwidth 52 greater than bandwidth 36 positioned in fundamental RF zone 34. Since distortion 50 is positioned in fundamental RF zone 34, it is not significantly blocked by output matching network 24 and load 26. Thus, the expanded bandwidth 52 of distortion 50 may, if not compensated, cause the transmitter to broadcast a signal outside of its allocated bandwidth 36 in fundamental RF zone 34.

When bandwidth 36 is narrower, double bandwidth 44 of video signal 42 is also narrower. At narrower bandwidths 36 and 44 conventional techniques may be used to attenuate video signal 42. Thus, a network of envelope trapping capacitors (not shown) may be used in a bias feed network of which RF choke inductor 12 is a part, to maintain low impedance throughout video zone 48. The low impedance bias feed network in video zone 48 attenuates video signal 42 and distortion 50. But, as bandwidths 36 and 44 increase, this technique becomes less effective because maintaining low impedance through a wider video zone 48 is more difficult while maintaining high impedance in fundamental RF zone 34 to block the RF output signal from biasing circuits. In addition, the use of a more extensive network of envelope trapping capacitors may lead to reduced amplifier linearity through worsened memory effects.

When bandwidth 36 is wider, double bandwidth 44 of video signal 42 is also wider. At both narrower and wider bandwidths 36 and 44 a different technique may be used to compensate for this video-signal induced form of distortion 50. An example of this different technique is described in U.S. Patent Pub. No. 2012/0106676 A1, dated 3 May 2012, entitled "Transmitter Linearized in Response to Signal Magnitude Derivative Parameter and Method Therefor," and assigned to the assignees hereof, which is incorporated by reference in its entirety herein. In general, a magnitude signal and a variable that correlates with the manner in which video signal 42 causes $V_{DS}$ to fluctuate are provided as inputs to a digital predistorter which predistorts a digital communication signal from which input signal $V_{GS}$ is formed. The variable that correlates with the manner in which video signal 42 causes $V_{DS}$ to fluctuate is the derivative of the magnitude signal. The digital predistorter adapts to converge at a point where predistortion has been configured to minimize distortion 50.

In order for digital predistortion to be effective, the distortion being compensated should be confined in a bandwidth which resides in video zone 48. That way, the sampling rates associated with digital processing can adequately characterize baseband versions of such distortion, which is then upconverted to fundamental RF zone 34 for application to RF amplifying device 14. Distortions that occupy a larger bandwidth cannot be adequately represented digitally when realistic digital sampling rates are too low to do so. Of course, digital sampling rates can be boosted in theory to adequately represent any arbitrarily large bandwidth. But limitations of semiconductor processing technologies, power consumption budgets, and costs place a realistic upper limit on digital sampling rates. For purposes of the present discussion, video zone 48 extends from DC for a span at least as large as double bandwidth 44 and desirably greater than bandwidth 44 to a maximum frequency which can be accurately represented digitally using the realistic sampling rate supported by the digital predistortion section of the transmitter.

A time-varying biasing signal may serve as $V_{DD}$ (FIG. 1). As a result PAE may improve. But $V_{DS}$ will also fluctuate in response to such a time-varying biasing signal, causing another form of distortion 50 having the unwanted fundamental RF zone 34 distortion effects for the same reasons as discussed above in connection with video signal 42. In accordance with envelope tracking (ET), envelope elimination and restoration (EER), and hybrid techniques between ET and EER, a time-varying biasing signal may be configured to roughly, closely, or identically follow the envelope of the RF communication signal. To some degree, conventional digital predistortion techniques may be followed to compensate for this form of distortion. But two factors limit the effectiveness of such compensation.

A first factor is that conventional predistortion techniques simply cannot compensate for gain collapse. Gain collapse occurs when RF amplifying device 14 is operated outside its saturation region 28 for periods of time that exceed fractions of a cycle of a fundamental RF waveform. In other words, gain collapse occurs when $V_{DS}<V_{GS}-V_T$ for extended periods. The envelope of the fundamental RF waveform represents amplitude modulation removed from angle modulation. A bandwidth 54 of the envelope is located in video zone 48 and spans a frequency range double that of bandwidth 36. Envelope bandwidth 54 is also the bandwidth of a magnitude signal extracted from a complex, digital baseband communication signal. Since envelope bandwidth 54 is located in video zone 48, it changes at a rate much slower than the fundamental RF waveform. Moreover, an envelope or magnitude signal occasionally exhibits amplitudes of zero or near zero. If biasing signals used in ET, EER, and hybrid biasing techniques are permitted to exhibit amplitudes of zero or near zero, gain collapse occurs and lasts for extended periods consistent with video bandwidth 48. Conventional digital predistortion techniques do not provide sufficient dynamic range to compensate for gain collapse. For example, when RF amplifying device 14 exhibits a gain of zero due to gain collapse, predistortion would need to perform the impossible task of providing a predistorting gain of infinity to compensate.

Envelope waveform shaping, or detroughing, may be performed as an alternate technique to predistortion for addressing the problem of gain collapse. Through a detroughing process, an envelope-tracking biasing signal is shaped so that the biasing signal never causes $V_{DS}<V_{GS}-V_T$ for extended periods. Consequently, conventional digital predistortion techniques need not address the gain collapse phenomenon.

But the second factor that limits the effectiveness of conventional techniques being able to compensate for gain collapse is that conventional detroughing processes merely trade more distortion in one form for less distortion of another form. Conventional detroughing techniques employ nonlinear processes to detrough the envelope-tracking signal. The nonlinear processes generate signal components that are harmonics of the envelope signal. Consequently, the envelope-tracking signal experiences its own spectral regrowth which causes its bandwidth to expand to being greater than double bandwidth 54. More precisely, this spectral regrowth causes the detroughed envelope-tracking signal to occupy a bandwidth which extends beyond video zone 48 and into an intermediate zone 56. Intermediate zone 56 represents the portion of the electromagnetic spectrum between video zone 48 and fundamental RF zone 34. Digital processing of signal components residing in intermediate zone 56 is generally ineffective because such signal components cannot be supported by the maximum realistic sampling rate used by the digital processing. Consequently, while conventional detroughing techniques are effective in addressing a specific gain collapse problem, they introduce another form of distortion that cannot be corrected through digital predistortion.

In accordance with one embodiment of the present invention, a transmitter is configured to implement an ET, EER, or hybrid technique for biasing an output of RF amplifying device 14 using a time-varying biasing signal that loosely, closely, or almost identically follows an envelope of the RF communication signal. Desirably, the transmitter is configured to implement both peak-to-average ratio (PAPR) reduction as well as detroughing. PAPR reduction reduces envelope peaks while detroughing fills envelope troughs.

Figure 5:
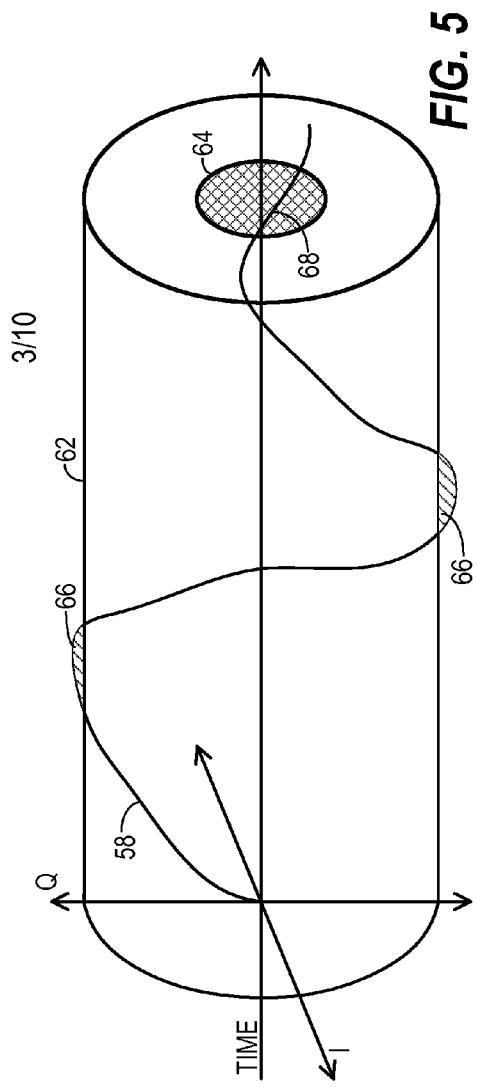
FIGS. 5 and 6 show charts of a representative envelope signal having a magnitude which exceeds a peak-identifying threshold at certain times and which troughs beneath a trough-identifying threshold at other times.
Figure 6:
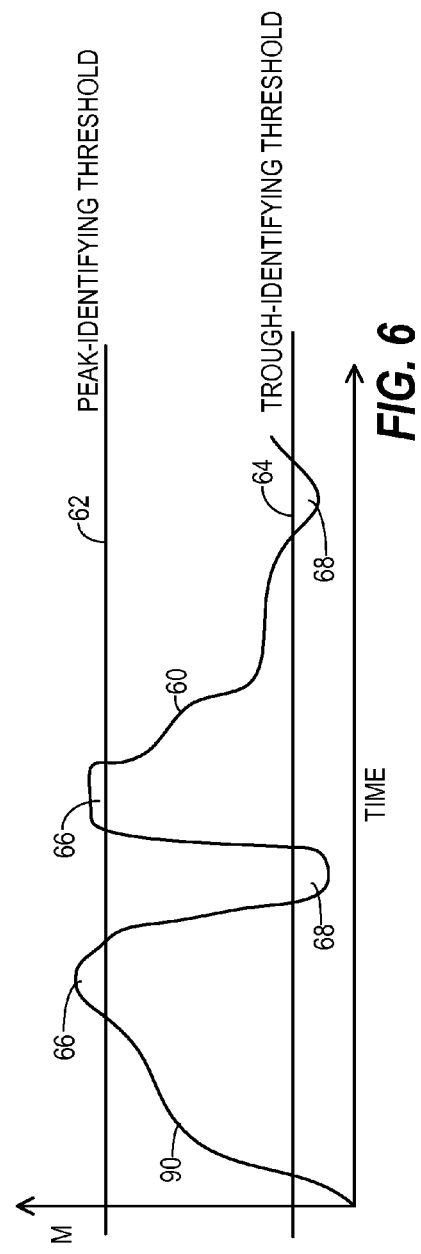

FIGS. 5 and 6 show charts of a representative communication signal 58 having a magnitude 60 which exceeds a peak-identifying threshold 62 at certain times and which troughs beneath a trough-identifying threshold 64 at other times. Magnitude 60 defines the envelope of the RF communication signal, while communication signal 58 conveys both phase and magnitude information. FIG. 5 shows a three-dimensional representation where communication signal 58 is represented as a complex signal having in-phase (I) and quadrature (Q) components. FIG. 6 shows only the magnitude M portion 60 of communication signal 58. FIG. 5 depicts communication signal 58 traversing an I-Q-time volume resembling a thick-walled pipe, with the exterior wall corresponding to peak-identifying threshold 62 and the interior wall corresponding to trough-identifying threshold 64. Peaks 66 represent those portions of communication signal 58 which extend beyond peak-identifying threshold 62. Peaks 66 are reduced in a peak-reduction section, discussed below, in response to peak-identifying threshold 62. Troughs 68 represent those portions of communication signal 58 which traverse the interior of the volume beneath trough-identifying threshold 64. Troughs 68 are filled in a trough-filling section, discussed below, in response to trough-identifying threshold 64.

Figure 7:
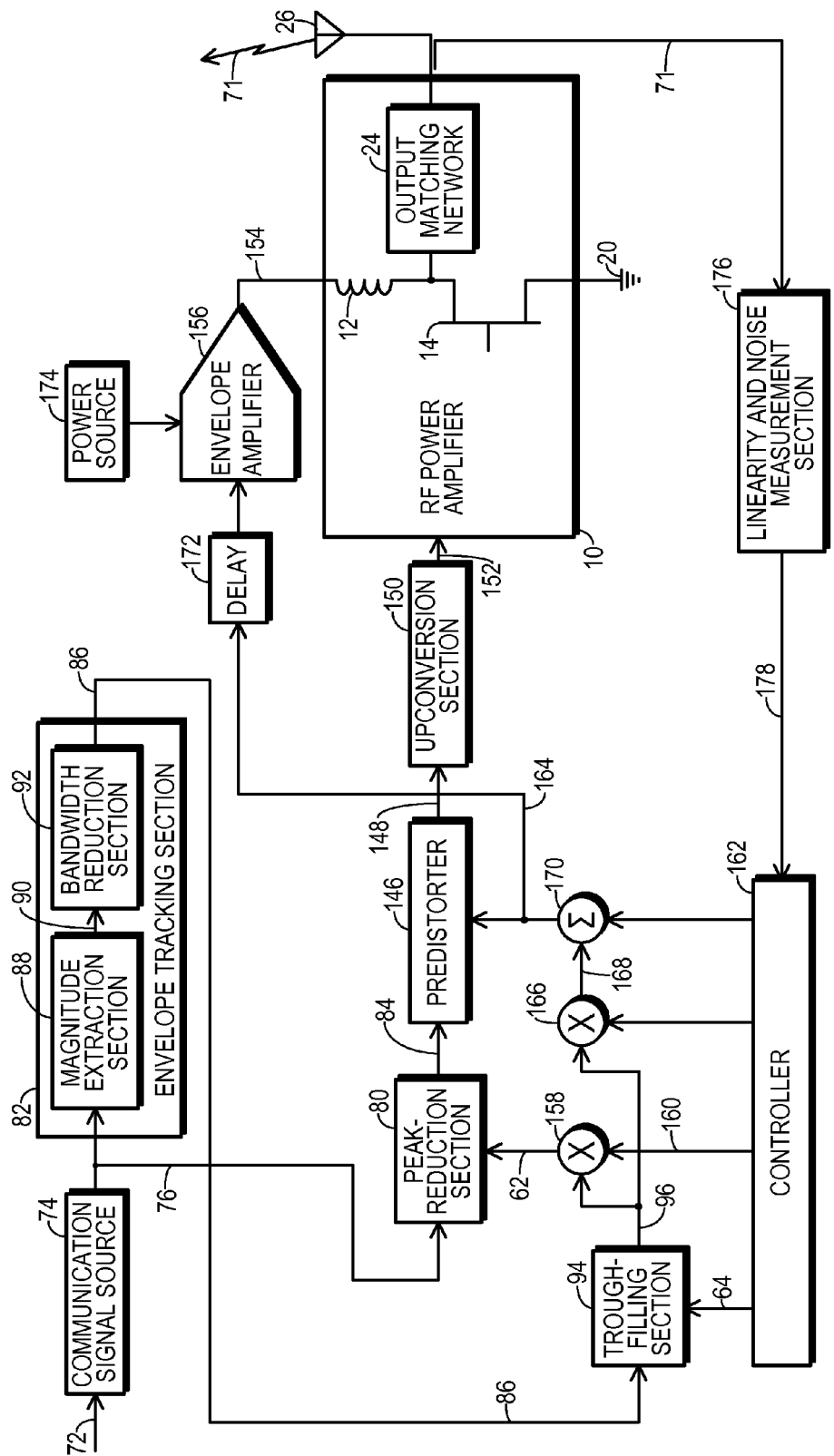
FIG. 7 shows a simplified block diagram of a transmitter configured in accordance with one embodiment of the present invention.

FIG. 7 shows a simplified block diagram of a transmitter 70 configured in accordance with one embodiment of the present invention to implement both PAPR reduction and detroughing. In the embodiment explicitly depicted in FIG. 7, transmitter 70 is configured to wirelessly transmit an amplified RF communication signal 71. Transmitter 70 is configured to employ a linear, envelope tracking (ET), RF power amplifier 10.

Upstream of RF power amplifier 10, transmitter 70 receives one or more user data streams 72 at an input to a communication signal source 74. Communication signal source 74 provides a digitally modulated, complex, baseband version of a communication signal 76. For the purposes of this discussion, any communication signal, such as communication signal 76 and others discussed below, is an electronic signal that may undergo a variety of different processing stages and be represented in a variety of different ways, including as one or more digital streams of data or as one or more analog signals. A communication signal has been modulated with information and/or data provided by user data stream(s) 72. The transmission of this information and/or data is the primary purpose of transmitter 70, and a communication signal could be demodulated or otherwise processed to recover the information and/or data. While a communication signal may have experienced a wide variety of processing stages, such stages have not destroyed the information and/or data conveyed in amplitude and phase so that such information and/or data would be unrecoverable.

Communication signal source 74 may perform any number of activities well known to those skilled in the art of digital transmitters. For example, user data stream 72 may be digitally modulated using a suitable form of digital modulation, such as QPSK, CDMA, OFDM, or the like. Multiple data streams 72 may have been digitally modulated and combined together for transmission, as is common in a cellular base station, or a single data stream 72 may have been digitally modulated for transmission, as is common in an end-user's wireless device, such as a cell phone, touchpad, laptop, netbook, electronic book reader, wireless network adapter, wireless router, and the like. The digitally modulated signal may have been pulse shaped to limit bandwidth while minimizing intersymbol interference (ISI). The processing performed by communication signal source 74 may inflate the peaks 66 (FIGS. 5-6) of the communication signal compared to what the peaks might have otherwise been and also altered troughs 68 (FIGS. 5-6) from what troughs might have otherwise been. Any or all of these and other types of signal processing activities may be performed at communication signal source 74.

As a result of the processing performed at communication signal source 74, communication signal 76 is a baseband, digitally modulated, complex signal that exhibits a bandwidth 78 (FIG. 4) less than or roughly equal to bandwidth 36 allocated to transmitter 70 for the transmission of RF energy. Bandwidth 78 is typically set by a governmental agency which controls licensing of the electromagnetic spectrum and devices that use the spectrum. For communication signal 76, bandwidth 78 resides at baseband (i.e., near DC) in the lower half of video zone 48 (FIG. 4). Desirably, communication signal 76 is an analytic signal having a bandwidth centered at or near 0 Hz.

As discussed above, baseband communication signal 76 may exhibit undesirably high peaks 66 (FIGS. 5-6), causing a peak-to-average power ratio (PAPR) parameter to be undesirably high as well. Likewise, communication signal 76 may exhibit undesirably low troughs 68 (FIGS. 5-6), which if used as a basis for generating an envelope-tracking bias signal could lead to gain collapse in RF amplifying device 14 and the unwanted nonlinearity, spectral regrowth, and distortion associated therewith. To address these concerns, an output of communication signal source 74 couples to an input of a peak-reduction section 80 to perform processing related to PAPR and also to an input of an envelope tracking section 82 to perform processing which addresses gain collapse.

Envelope tracking section 82 forms a deeper-trough envelope tracking signal 86 from baseband communication signal 76. For the purposes of this invention, the term "deeper-trough" will be understood strictly in a comparative sense relative to a shallower-trough envelope tracking signal discussed below. Compared to the shallower-trough envelope tracking signal, deeper-trough envelope tracking signal 86 has deeper troughs 68. Other than in comparison with the shallower-trough envelope tracking signal, no limitation whatsoever is implied with respect to the depth of troughs 68 in deeper-trough envelope tracking signal 86. Moreover, deeper-trough envelope tracking signal 86 is configured to track the envelope of amplified RF communication signal 71 for the purposes of forming a time-varying biasing signal for RF amplifying device 14.

Envelope tracking section 82 includes a magnitude extraction section 88. Magnitude extraction section 88 extracts a magnitude signal 90 from baseband communication signal 76. In other words, magnitude signal 90 describes the magnitude portion 60 (FIG. 6) of the digital, complex, baseband form of the communication signal and describes no phase information. Referring to FIGS. 5-6, magnitude extraction section 88 converts communication signal 58 (FIG. 5) into the magnitude waveform shown in FIG. 6. Magnitude signal 90 exhibits double bandwidth 54 (FIG. 4), where baseband communication signal 76 exhibits a single bandwidth 78 (FIG. 4). Magnitude signal 90 also substantially describes the envelope of amplified RF communication signal 71 amplified by RF power amplifier 10 and broadcast from transmitter 70.

In one embodiment, magnitude signal 90 may, without further processing, serve as deeper-trough envelope tracking signal 86. In such an embodiment, an optional bandwidth reduction section 92 is omitted and deeper-trough envelope tracking signal 86 exhibits double bandwidth 54. Such an embodiment is useful when an EER technique is being used to bias RF amplifying device 14. Such an embodiment may also be useful when a hybrid between and EER and ET technique is being used to bias RF amplifying device 14. In these situations the bias signal being generated for RF amplifying device 14 will closely or almost identically follow magnitude signal 90. A very high PAE may be achieved in these situations.

In another embodiment, bandwidth reduction section 92 is included in envelope tracking section 82, and an output of magnitude extraction section 88 couples to an input of bandwidth reduction section 92. Bandwidth reduction section 92 processes magnitude signal 90 to reduce its bandwidth. The reduced-bandwidth signal generated by bandwidth reduction section 92 serves as deeper-trough envelope tracking signal 86 and exhibits a reduced bandwidth 93 (FIG. 4). Reduced bandwidth 93 is less than double bandwidth 54 exhibited by magnitude signal 90, but the amount of reduction is not critical for purposes of the present invention. In some embodiments, reduced bandwidth 93 may exhibit a bandwidth less than single bandwidth 78. This embodiment may be useful when an ET technique or a hybrid between ET and EER techniques is being used to generate the bias signal for RF amplifying device 14. In such applications the bias signal being generated for RF amplifying device 14 will roughly follow magnitude signal 90. A high PAE may still be achieved in these situations, with higher PAE being more easily achievable the more closely deeper-trough envelope tracking signal 86 tracks magnitude signal 90 and exhibits double bandwidth 54.

The use of a reduced bandwidth form of deeper-trough envelope tracking signal 86 may be desirable for a couple of different reasons. First, a reduced-bandwidth 93 form of a biasing signal to be generated from a reduced-bandwidth deeper-trough envelope tracking signal 86 may be provided to RF amplifying device 14 by a less expensive and/or more efficient envelope amplifier (discussed below). Second, a reduced-bandwidth 93 form of the biasing signal may place fewer demands on the generation of predistortion. As discussed above, the biasing signal intermodulates with the fundamental RF signal in RF amplifying device 14 to produce one form of distortion 50 that spans extended bandwidth 52 (FIG. 4). When the biasing signal bandwidth is reduced, so is expanded bandwidth 52. When expanded bandwidth 52 is reduced, digital predistortion efforts may be more effective in compensating for distortion 50 and/or lower sampling rates may be used in digital predistortion circuits and other downstream digital circuits.

Envelope tracking section 88 may generate deeper-trough envelope tracking signal 86 by following conventional techniques. One example of an envelope tracking section that reduces bandwidths and that may be used in transmitter 70 is described in U.S. Pat. No. 7,570,931, issued 4 Aug. 2009, and entitled "RE Transmitter With Variably Biased RF Power Amplifier And Method Therefor," and is incorporated by reference in its entirety herein. In general, any envelope tracking section directed toward the following three goals may be adequate for the purposes of transmitter 70. First, deeper-trough envelope tracking signal 86 should remain at an amplitude greater than or equal to the amplitude of magnitude signal 90 at substantially every sample. Second, deeper-trough envelope tracking signal 86 should remain at as low an amplitude as possible for as long as possible without violating the first goal. And third, deeper-trough envelope tracking signal 86 may exhibit a reduced bandwidth 93 sufficiently low that a practical and economical implementation of an envelope amplifier (discussed below) can track it and so that a practical and economical digital predistortion circuit (discussed below) may compensate for the distortion 50 the biasing signal causes without violating the first and second goals, but no lower than necessary.

Deeper-trough envelope tracking signal 86 drives an input of a trough-filling section 94. Trough-filling section 94 performs envelope waveform shaping, or detroughing, on deeper-trough envelope tracking signal 86 to form a shallower-trough envelope tracking signal 96. For the purposes of this invention, the term "shallower-trough" will be understood strictly in a comparative sense relative to deeper-trough envelope tracking signal 86. Compared to deeper-trough envelope tracking signal 86, shallower-trough envelope tracking signal 96 has shallower troughs 68 (FIGS. 5-6). Other than in comparison with deeper-trough envelope tracking signal 86, no limitation whatsoever is implied with respect to the depth of troughs 68 in shallower-trough envelope tracking signal 96. Trough-filling section 94 identifies troughs 68 in deeper-trough envelope tracking signal 86, and boosts the amplitude of deeper-trough envelope tracking signal 86 in the vicinity of troughs 68 by an amount that will substantially prevent gain collapse in RF amplifying device 14. Moreover, in a preferred embodiment trough-filling section 94 boosts the amplitude sparingly to reduce distortion 50 and boosts the amplitude in a linear, additive manner that maintains and does not expand the bandwidth of deeper-trough envelope tracking signal 86. Due to the operation of this trough-filling section 94, extended bandwidth 52 (FIG. 4) of intermodulation distortion 50 resulting from applying a time-varying bias signal to RF amplifying device 14 is constrained to a span that can be effectively compensated through realistic digital baseband processing.

Figure 8:
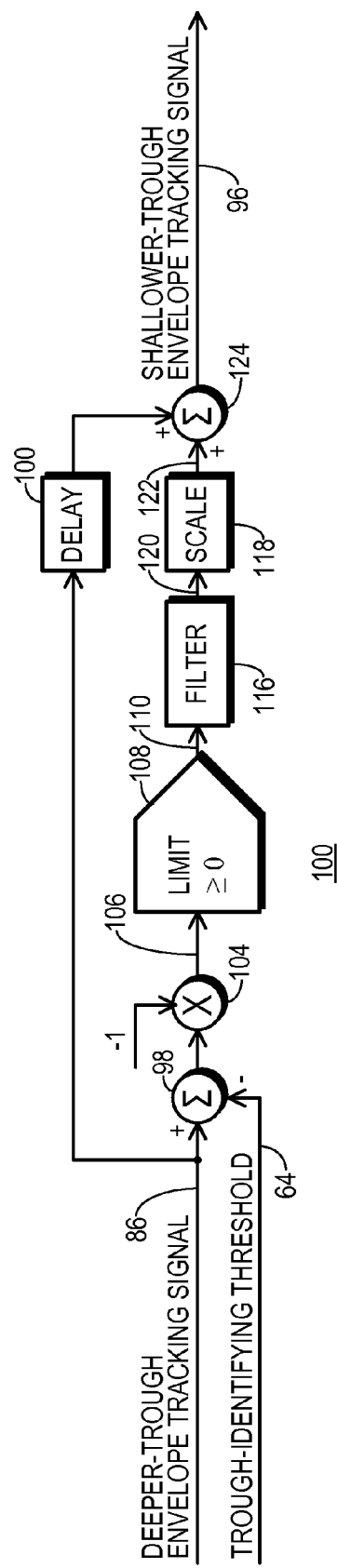
FIG. 8 shows a simplified block diagram of one embodiment of a trough-filling section of the transmitter shown in FIG. 7.

FIG. 8 shows a simplified block diagram of one embodiment of trough-filling section 94. FIGS. 9-15 show signal charts depicting a series of processing stages applied to deeper-trough envelope tracking signal 86 in trough-filling section 94. As shown in FIG. 8, deeper-trough envelope tracking signal 86 is provided to a positive input of a subtraction circuit 98 and to a delay element 100. The chart of FIG. 9 depicts an exemplary representation of a section of deeper-trough envelope tracking signal 86. Deeper-trough envelope tracking signal 86 is characterized by many troughs 68 and many peaks 66. A peak 66 is a local peak relative to immediate future and past portions of signal 86. Other portions of signal 86 separated a significant distance in time from any local peak may exhibit a higher amplitude. But only a few local peaks (FIG. 9 shows one) represent excursions above peak-identifying threshold 62, labeled Mp in FIG. 9. Likewise, a trough 68 is a local trough relative to immediate future and past portions of signal 86. Other portions of signal 86 separated a significant distance in time from any local trough may exhibit a still lower amplitude. But only a few local troughs (FIG. 9 shows one) represent signal tracks below trough-identifying threshold 64, labeled $M_T$ in FIG. 9. Each of these few local troughs exhibit its own minimum amplitude 101. Minimum amplitude 101 is a troughing amount 102 less than trough-identifying threshold 64. Trough-identifying threshold 64 is provided to a negative input of subtraction circuit 98. Trough-identifying threshold 64 is provided by a controller and is discussed along with a control loop which generates and continuously adjusts threshold 64 in more detail below.

The chart of FIG. 10 shows the processing stage performed by subtraction circuit 98. The amplitude of each sample in deeper-trough envelope tracking signal 86 is lowered by the amount of trough-identifying threshold 64, making minimum amplitudes 101 less than zero by troughing amount 102 in a signal output from subtraction circuit 98. As shown in FIG. 8, this signal output from subtraction circuit 98 is supplied to a negation circuit 104, where it is effectively multiplied by a negative one. FIG. 11 shows the results of the processing stage performed by negation circuit 104 and a resulting negated signal 106. In negated signal 106, the troughs 68 that are below threshold 64 in deeper-trough envelope tracking signal 86 now appear as peaks and are the only positive portions of negated signal 106.

FIG. 8 shows that negated signal 106 drives a limit circuit 108. Limit circuit 108 is configured so that positive portions of negated signal 106 pass through limit circuit 108 substantially unaltered and negative portions of negated signal 106 are set to zero. FIG. 12 shows a resulting raw troughing signal 110 output by limit circuit 108. The portion of troughs 68 less than trough-identifying threshold 64 in deeper-trough envelope tracking signal 86 have been isolated. Raw troughing signal 110 is responsive to this portion of deeper-trough envelope tracking signal 86 and is unresponsive to portions of deeper-trough envelope tracking signal 86 having amplitudes greater than threshold 64, including peaks 66. Extremes 112 of raw troughing signal 110 are shown as samples having amplitudes corresponding to their troughing amounts 102. Significant portions of raw troughing signal 110 exhibit amplitudes substantially equal to zero.

Raw troughing signal 110 could be added to an appropriately delayed version of deeper-trough envelope tracking signal 86 to effectively cancel troughs 68 having amplitudes less than threshold 64. But, due to the limiting operation of limit circuit 108, raw troughing signal 110 exhibits an expanded bandwidth 114 (FIG. 4) which is greater than reduced bandwidth 93 exhibited by deeper-trough envelope tracking signal 86. In fact, expanded bandwidth 114 may be substantially greater than reduced bandwidth 93 and extend into intermediate zone 56 (FIG. 4) due to the addition of harmonics of deeper-trough envelope tracking signal 86 to generate the waveform of raw troughing signal 110 from negated signal 106. If raw troughing signal 110 were used in a cancellation operation, the resulting detroughed signal would span the same substantially greater bandwidth which extends into intermediate zone 56. Such a detroughed signal would likely be effective in preventing gain collapse in RF amplifying device 14, but would cause nonlinearity and spectral regrowth that could not be effectively compensated for using realistic digital predistortion.

Thus, FIG. 8 shows that raw troughing signal 110 drives a filtering circuit 116 and a scaling circuit 118. Those skilled in the art will appreciate that filtering and scaling circuits 116 and 118 may be combined into one filtering circuit by appropriate configuration of filter coefficients, but circuits 116 and 118 are shown separately here to discuss two separate features. In one embodiment, filtering circuit 116 desirably implements a low pass filter having a corner frequency set around the highest frequency in reduced bandwidth 93 (FIG. 4). In another embodiment, filtering circuit 116 may implement a low pass filter having a response characteristic which mimics a spectral mask (discussed below) with which transmitter 70 complies. In yet another embodiment, filtering circuit 116 may implement a low pass filter having a corner frequency set below the highest frequency in deeper-trough envelope tracking signal 86 reduced bandwidth 93. But in each embodiment, filtering circuit 116 generates a filtered signal 120 having a bandwidth less than expanded bandwidth 114 (FIG. 4), even around the time span that encompasses extremes 112. Filtering circuit 116 may, but is not required to, be a static filter whose coefficients do not change or otherwise adapt over time.

FIG. 13 shows filtered signal 120. Filtered signal 120 includes the troughs 68 isolated in raw troughing signal 110, but at reduced amplitude from the troughing amount 102 amplitude of raw troughing signal 110. And, these troughs 68 are now spread out in time to accommodate the bandwidth reduction. Desirably, the bandwidth of filtered signal 120 is no greater than reduced bandwidth 93 of deeper-trough envelope tracking signal 86.

But filtered signal 120 cannot be simply combined with deeper-trough envelope tracking signal 86 to effectively cancel troughs 68 because the filtering stage has attenuated extreme 112. Accordingly, scaling circuit 118 is configured to restore extreme 112 in filtered signal 120 to troughing amount 102. FIG. 14 shows a trough-filling signal 122 which results from this scaling stage. The absolute value of extreme 112 is scaled to substantially equal troughing amount 102. Significant portions of trough-filling signal 122 equal zero. Trough 68, which appears as a positive pulse in this embodiment of trough-filling signal 122, is spread out in time compared to its corresponding occurrence in raw troughing signal 110. Scaling circuit 118 may, but is not required to, apply a static scaling value that does not change or otherwise adapt over time. And, as discussed above scaling circuit 118 may be combined with filtering circuit 116.

As shown in FIG. 8, trough-filling signal 122 is applied to a first input of a combiner 124. Deeper-trough envelope tracking signal 86 is applied to a second input of combiner 124 after being delayed in delay element 100. Delay element 100 is desirably configured so that after this delay deeper-trough envelope tracking signal 86 is temporally aligned with trough-filling signal 122. In the embodiment depicted in FIG. 8, the combining stage at combiner 124 implements an addition operation. This addition operation causes troughs 68 which have amplitudes below trough-identifying threshold 64 to be substantially cancelled without generating harmonics for the added signals.

The signal chart of FIG. 15 shows shallower-trough envelope tracking signal 96, which is formed from detroughing deeper-trough envelope tracking signal 86 at combiner 124. FIG. 15 shows a detroughed portion 126 where shallower-trough envelope tracking signal 96, shown as a solid line, differs from a corresponding portion of deeper-trough envelope tracking signal 86, shown as the dotted line. The corresponding trough 68 in detroughed portion 126 has been filled in accordance with an additive cancellation process. After detroughing, this trough 68 has been filled so that its minimum amplitude substantially equals trough-identifying threshold 64. Thus, shallower-trough envelope tracking signal 96 has a shallower corresponding trough 68 relative to deeper-trough envelope tracking signal 86.

Trough-filling signal 122 (FIG. 14), which is added to deeper-trough envelope tracking signal 86 to form shallower-trough envelope tracking signal 96, represents distortion that is added into deeper-trough envelope tracking signal 86 to detrough deeper-trough envelope tracking signal 86. This distortion corresponds to distortion in the biasing signal being formed to bias RF amplifying device 14, and leads to a reduction in PAE from the PAE theoretically achievable without adding this distortion. This distortion is held to a minimum by configuring trough-filling signal 122 to exhibit a value of substantially zero at all samples except for those in the vicinity of detroughed portion 126. Detroughed portion 126 extends over a longer span of time than the corresponding pulse of raw troughing signal 110 (FIG. 12) and corresponding trough 68 of signal 86 due to low-pass filtering that reduces bandwidth in trough-filling signal 122 to a level that maintains a bandwidth of distortion 50 (FIG. 4) sufficiently low so that it can be compensated using realistic digital predistortion.

While FIG. 8 shows one embodiment of trough-filling section 94, those skilled in the art will appreciate that other embodiments will also suffice for the purposes of transmitter 70. For example, trough-filling section 94 may be configured so that the signals depicted in FIGS. 11-14 are the negative of the ones shown and so that combiner 124 performs a subtraction operation. These and other modifications fall within the scope of the present invention.

Referring back to FIG. 7, peak-reduction section 80 processes digital, complex, baseband communication signal 76 to reduce PAPR. Peak-reduction section 80 desirably applies a peak reduction process. Desirably, a peak-reduced baseband communication signal 84 form of the communication signal remains compatible with spectral mask and other noise specifications (e.g., EVM specifications) imposed on transmitter 70 while exhibiting a lower PAPR than baseband communication signal 76.

One example of a PAPR reduction circuit is described in U.S. Pat. No. 7,747,224, issued 29 Jun. 2010, entitled "Method and Apparatus For Adaptively Controlling Signals", and assigned to the assignees hereof, which is incorporated by reference in its entirety herein. A PAPR reduction circuit like the one described in U.S. Pat. No. 7,747,224 and elsewhere, reduces the PAPR of the communication signal prior to amplification. Peak reduction is desirable because it allows the transmitter's amplifier to operate at a lower backoff point relative to average signal power. By operating at a lower average power backoff point, average signal power may be increased. Other advantages follow, including operating the amplifier at a greater level of PAE, more link capacity, an ability to use a lower cost amplifier, and efficiency improvements in the use of the spectrum. Another advantage is that it reduces the number of troughs 68 which need to be filled to avoid gain collapse in RF amplifying device 14 and reduces the average troughing amounts 102 (FIG. 9) of the troughs 68 which need to be filled to avoid gain collapse. Accordingly, the total amount of distortion which is added into deeper-trough envelope tracking signal 86 in order to fill troughs 68 is reduced.

Figure 16:
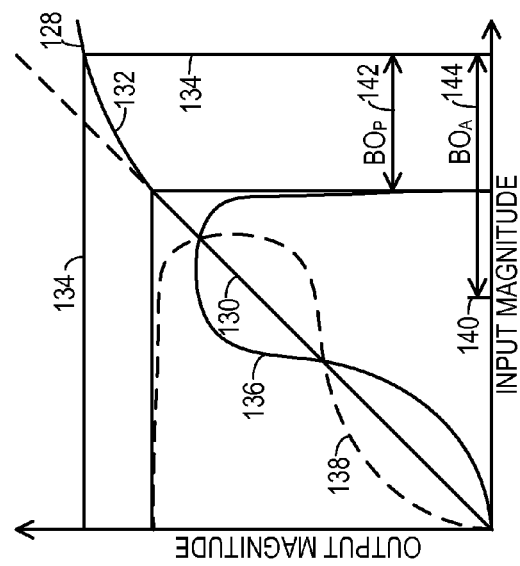
FIGS. 16-18 show charts that graphically depict an exemplary signal magnitude probability density function and an exemplary transfer characteristic of an amplifier section of the transmitter depicted in FIG. 7 while operating with little or no peak reduction (FIG. 16), with peak reduction but no backoff adjustment in response to the peak reduction (FIG. 17), and with peak reduction and with backoff adjustment in response to the peak reduction (FIG. 18)
Figure 17:
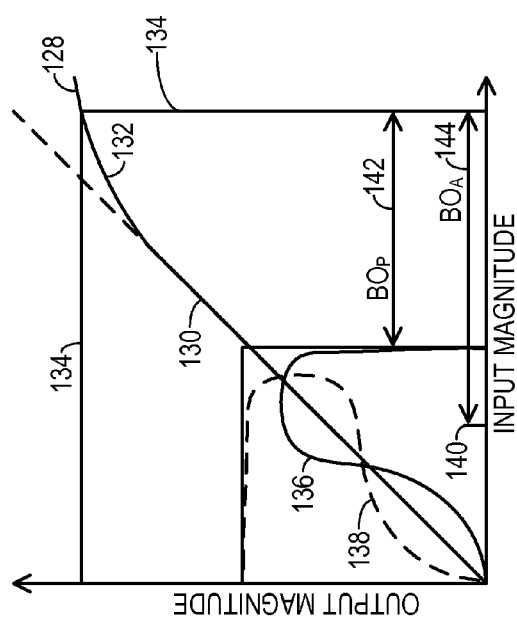
Figure 18:
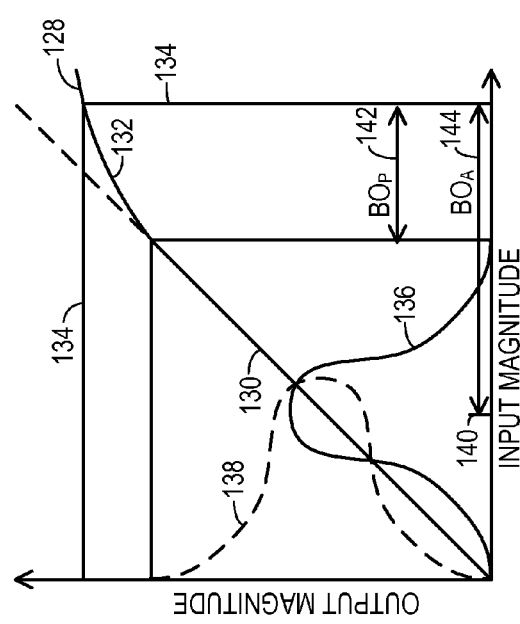

The operation of peak-reduction section 80 may be understood by reference to FIGS. 16-18, which show charts that graphically depict an exemplary signal magnitude probability density function and an exemplary transfer characteristic of RF power amplifier 10 configured to follow an ET or a hybrid between ET and EER biasing techniques. Each of FIGS. 16-18 shows a simplified version of a transfer function 128 for RF power amplifier 10 (FIG. 7) depicting the relationship between input power and output power for RF power amplifier 10. Transfer function 128 has a linear range 130 and a nonlinear range 132. In linear range 130, transfer function 128 exhibits a substantially linear, substantially straight-line, relationship. In nonlinear range 132, transfer function 128 exhibits a nonlinear relationship often referred to as gain droop. A peak bias level 134 is depicted for RF power amplifier 10. Peak bias level 134 represents that bias level applied to RF power amplifier 10 by an ET or hybrid biasing technique at the peaks of the envelope of the signal being amplified in RF power amplifier 10. Linear range 130 ends and nonlinear range 132 begins at a point less than peak bias level 134.

In each of FIGS. 16-18, solid line curve 136 depicts an exemplary probability density function (PDF) of peak-reduced signal 84 and dotted-line curve 138 depicts a corresponding probability density function of amplified signal 71 output by RF power amplifier 10. The average magnitude for peak-reduced signal 84 is denoted at average power point 140. Those skilled in the art will appreciate that the precise shape of curves 136 and 138 will differ depending upon the modulation type currently being used by transmitter 70 and upon whether a single user data stream 72 or multiple data streams 72 are being modulated. And, the location of average power points 140 will likewise differ depending upon these details.

FIG. 16 depicts the application of little or no peak reduction in peak-reduction section 80. This scenario is a hypothetical scenario provided to serve as a baseline for comparison purposes with the scenarios depicted in FIGS. 17-18. During normal operation, transmitter 70 should not operate in the FIG. 16 scenario because this scenario produces an equivalent result to altogether omitting peak-reduction section 80 from transmitter 70. But the FIG. 16 scenario may be brought about in transmitter 70 by increasing peak-identifying threshold 62 (FIGS. 5-6) to a maximum value. Peak-reduction section 80 will decrease its peak reduction to zero, which leads to increased peaks in peak-reduced signal 84. In this FIG. 16 scenario, input power PDF 136 exhibits long, thin tails both above and below average power point 140. In other words, peak-reduced signal 84 seldom exhibits high peaks, but those high peaks are considerably greater than average power point 140.

In the FIG. 16 scenario, in order to prevent gain droop in RF power amplifier 10 but otherwise achieve the maximum amplification possible, the input power backoff level is adjusted so that substantially the entirety of peak-reduced signal 84, including the highest peaks of signal 84, remains within linear range 130 of RF power amplifier 10. Peak backoff ($BO_P$) 142 represents the difference between the level of the peaks in peak-reduced signal 84 (i.e., highest input magnitude portion) and peak bias level 134. This is also the difference between peak bias level 134 and the point where linear range 130 ends and nonlinear range 132 begins.

Average backoff ($BO_A$) 144 represents the difference between average magnitude point 140 and peak bias level 134. In this FIG. 16 scenario, average backoff 144 is undesirably large. The undesirably large average backoff 144 results in poor power added efficiency (PAE) and an undesirably low signal level for amplified RF signal 71 broadcast from transmitter 70.

FIG. 17 depicts the application of peak reduction in peak-reduction section 80, but no adjustment in backoff for RF power amplifier 10 from the levels depicted for the FIG. 16 scenario. This FIG. 17 scenario may be brought about by freezing the operation of a backoff controller (not shown). FIG. 17 also depicts a hypothetical scenario presented for comparison with the FIGS. 16 and 18 scenarios. For normal operation, the backoff controller should not be frozen but should be allowed to find that point of operation where PDF 136 is moved as far to the right as possible with little or no part of PDF 136 extending into nonlinear range 132.

In this FIG. 17 scenario, peak-reduction section 80 increases the amount of peak-reduction from the amount provided in the FIG. 16 scenario, which will in-turn lead to reduced or lower peaks in peak-reduced signal 84. In this FIG. 17 scenario, input power PDF 136 exhibits a short, fat tail above average power point 140. In other words, the peaks are constrained to being much closer to average power point 140. The areas under PDF curve 136 in FIGS. 16 and 17 are equal, and average power points 140 in FIGS. 16 and 17 are little changed. But the area in the upper long tail from FIG. 16 is now removed and added back, primarily above but closer to average magnitude point 140. Furthermore, average backoff ($BO_A$) 144 is still undesirably large and little changed from the FIG. 16 scenario, but peak backoff ($BO_P$) 142 is much larger than in the FIG. 16 scenario. The undesirably large average backoff 144 again results in poor power added efficiency (PAE) for RF power amplifier 10, and an undesirably low signal level for amplified signal 71 broadcast from transmitter 70. But the FIG. 17 scenario is a hypothetical scenario due to the hypothetical freezing of the backoff controller.

Turning now to FIG. 18, the effects of unfreezing the backoff controller are depicted. No changes are made in peak reduction from the FIG. 17 scenario. FIG. 18 depicts an actual, normal operating scenario for transmitter 70. This FIG. 18 scenario depicts a decrease in the peak backoff ($BO_P$) 142 and in average backoff ($BO_A$) 144 from the levels of the hypothetical FIG. 17 scenario. While peak backoff ($BO_P$) 142 has decreased approximately to the same level as depicted in the FIG. 16 scenario, average backoff ($BO_A$) 144 has now decreased to a level much smaller than shown in either of the hypothetical FIG. 16 or FIG. 17 scenarios. A desirably high signal level is now exhibited by amplified RF signal 71. Moreover, the area below average power point 140, where detroughing is likely to be needed, is amplified compared to the FIGS. 16 and 17 scenarios. Consequently, fewer troughs 68 require filling, and those troughs 68 which require filling require the addition of less distortion into deeper-trough envelope tracking signal 86 to do so.

FIGS. 16-18 show that a backoff controller operates as an automatic gain controller (AGC) to maximize the amplification provided by RF power amplifier 10 while maintaining a predetermined degree of linearity. In normal operational scenarios, the backoff controller remains unfrozen. Accordingly, this backoff controller continuously adjusts the gain applied to the communication signal upstream of RF power amplifier 10. In particular, the backoff controller uses a linearity metric to determine when RF power amplifier 10 has reached a linearity threshold. When linearity falls below the threshold, gain is decreased to improve linearity, and when linearity goes too far above the threshold, gain is increased to increase amplification.

Referring back to FIG. 7, an output from peak-reduction section 80 couples to a first input of a digital predistorter 146. Predistorter 146 intentionally distorts peak-reduced baseband communication signal 84, converting it into a complex, digital, predistorted baseband communication signal 148. An output of predistorter 146 couples to an input of an upconversion section 150. Predistorter 146 is discussed in more detail below in connection with FIG. 20. Upconversion section 150 converts complex, digital predistorted baseband communication signal 148 into a complex analog signal, mixes the analog signal with a pair of RF oscillation signals (not shown) in phase quadrature, and then combines and filters the resulting RF signals into an RF communication signal 152. RF communication signal 152 is positioned in fundamental RF zone 34 (FIG. 4) and roughly exhibits expanded bandwidth 52 due to bandwidth expansion occurring in predistorter 146. Desirably, in addition to the communication signal, RF communication signal 152 occupying expanded bandwidth 52 desirably includes distortion which is configured to compensate for distortions 50 resulting from intermodulation with the lower sideband of at least the second harmonic of the fundamental signal and with a time-varying biasing signal, each of which appear in video zone 48 (FIG. 4).

RF communication signal 152 is provided to the input of RF power amplifier 10. At power amplifier 10, amplified RF communication signal 71 is generated in response to RF communication signal 152 and a biasing signal 154 supplied by an envelope amplifier 156. FIG. 7 depicts load 26 as being an antenna from which amplified RF communication signal 71 is broadcast.

Shallower-trough envelope tracking signal 96 drives a first input of a scaling section 158, and a second input of scaling section 158 receives a control signal 160 from a controller 162. In this embodiment, peak-identifying threshold 62 is derived from shallower-trough envelope tracking signal 96 in scaling section 158 and provided to an input of peak-reduction section 80 for use in applying the peak reduction process by identifying specific peaks to reduce in the baseband communication signal. Biasing signal 154 supplied by envelope amplifier 156 is generated in response to a bias control signal 164 supplied to an input of envelope amplifier 156. Bias control signal 164 is also provided to a second input of predistorter 146. Shallower-trough envelope tracking signal 96 is also used to derive bias control signal 164.

In particular, shallower-trough envelope tracking signal 96 is supplied to a first input of a scaling section 166, and a control signal from controller 162 drives a second input of scaling section 166. A scaled tracking signal 168 generated by scaling section 166 then drives a first input of an offset section 170, where a second input of offset section 170 is driven by another control signal from controller 162. An output of offset section 170 generates bias control signal 164. Bias control signal 164 drives envelope amplifier 156, after delay in a delay element 172.

Envelope amplifier 156 receives input power from a power source 174. Envelope amplifier 156 is configured to convert the input power from power source 174 into biasing signal 154 in a manner that tracks bias control signal 164 and shallower-trough envelope tracking signal 96. Power source 174 may be, but is not required to be, a battery. Conventional examples of envelope amplifiers used in implementing ET, EER, and hybrid RF power amplifier biasing techniques may serve as envelope amplifier 156 in transmitter 70. Such conventional examples include combining a higher bandwidth, less efficient, linear amplifier with a lower bandwidth, more efficient switching amplifier and a control system. Such resulting envelope amplifiers are often capable of providing a wide bandwidth biasing signal 154 at high PAE. But other techniques may also be used for implementing envelope amplifier 156.

Amplified RF communication signal 71 is fed back to a linearity and noise measurement section 176. Measurement section 176 desirably down-converts and digitizes signal 71, then processes signal 71 to generate metrics 178. Metrics 178 are applied to an input of controller 162. In response to metrics 178, controller 162 adjusts the control signals it supplies to trough-filling section 94, scaling section 158, scaling section 166, and offset section 170. Bias control signal 164, trough-identifying threshold 64, and peak-identifying threshold 62 are continuously adjusted to maximize PAE for RF power amplifier 10 while operating transmitter 70 within limits imposed by a spectral mask. Peak-identifying threshold 62 is adjusted to hold error vector magnitude (EVM) at a desired or specified level. Preferably, controller 68 implements different dither control loops having considerably different substantially uncorrelated dither sequences or having different bandwidths so that the different control loops are substantially independent from one another.

Figure 19:
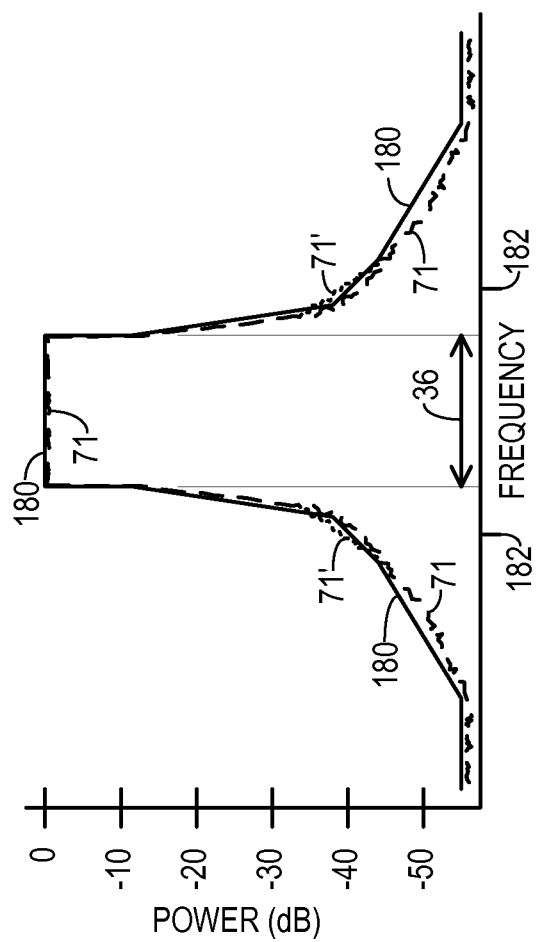
FIG. 19 shows an exemplary spectral mask relative to an exemplary spectral plot of an amplified RF communication signal broadcast from the transmitter depicted in FIG. 7

FIG. 19 shows an exemplary spectral mask 180 relative to an exemplary spectral plot of amplified RF communication signal 71 broadcast from transmitter 70. Spectral mask 180 may be specified by governmental or other regulations and indicates the relative amounts of power that transmitter 70 is permitted to broadcast at different frequencies. Spectral mask 180 is depicted as permitting signal 71 to exhibit a certain amount of power, labeled 0 dB in FIG. 19, within bandwidth 36, which is located in fundamental RF zone 34 (FIG. 4). In order for transmitter 70 to operate in compliance with spectral mask 180, the power of signal 71 needs to remain beneath the contour of spectral mask 180, both in-band (i.e., within bandwidth 36 in RF zone 34) and out-of-band (ie., outside bandwidth 36 in RF zone 34). Desirably, both baseband communication signal 76 (FIG. 7) and peak-reduced signal 84 (FIG. 7) exhibit a bandwidth substantially equal to bandwidth 36. But signals 76 and 84 are located at baseband rather than in fundamental RF zone 34, where FIG. 19 depicts bandwidth 36. FIG. 19 shows that transmitter 70 transmits a greater portion of amplified RF communication signal 71 within in-band portion 36 of the electromagnetic spectrum and a lesser portion of amplified RF communication signal 71 within the out-of-band portion of the electromagnetic spectrum.

FIG. 19 depicts a linearity metric that controller 162 may monitor to adjust trough-identifying threshold 64, and to adjust scaling and offset control signals for scaling section 166 and offset section 170. In particular, FIG. 19 shows amplified RF communication signal 71 as a dashed-line that resides below spectral mask 180, but desirably remains very close to spectral mask 180 to maximize amplification. FIG. 19 further shows a dotted-line 71' which extends slightly above spectral mask 180 at sensitive out-of-band points 182 in spectral mask 180. Amplified signal 71 follows trace 71' when linearity just starts to deteriorate. The deterioration is signified by a small amount of nonlinear amplification that causes spectral regrowth in amplified signal 71, and this spectral regrowth is of a sufficient degree that signal 71 now exceeds spectral mask 180.

Accordingly, in one embodiment controller 162 monitors metrics 178 to focus upon sensitive out-of-band points 182. When controller 162 detects a signal level above spectral mask 180, or preferably above a point immediately beneath spectral mask 180 at out-of-band points 182 to provide a suitable margin, action is taken to improve linearity. That action may be to increase trough-identifying threshold 64. Then, a greater amount of detroughing will occur and RF amplifying device 14 will operate further from bias points where gain collapse or other nonlinearities begin to occur. For control loops that adjust scaling section 166 and offset section 170, scale factors and offsets may increase to promote greater linearity. When controller 162 detects a signal level below spectral mask 180 at out-of-band points 182, action is taken to improve PAE. Such actions include reducing trough-identifying threshold 64 and/or reducing scaling and offsets applied at scaling section 166 and offset section 170. As a result, trough-identifying threshold 64 and the other control parameters are adjusted to maintain the out-of-band portion of amplified RF communication signal 71 at points 182 at a substantially constant predetermined power level which complies with spectral mask 180, but just barely complies.

The control loops which are implemented in response to controller 162 monitoring metrics 178 also encourage RF power amplifier 10 not to operate at a biasing point too near threshold voltage $V_T$ and to track thermal sensitivity in $V_T$. Thus, as output capacitance in RF amplifying device 14 becomes increasingly nonlinear with operation closer to $V_T$, and as $V_T$ changes in response to changing temperature, RF power amplifier 10 is operated to maximize PAE while operating within limits imposed by spectral mask 180.

Referring back to FIG. 7, different architectures known to those of skill in the art may be employed for predistorter 146 in transmitter 70. Desirably, the architecture of predistorter 146 is operated at a realistic sampling rate and otherwise configured to consume no more power than is necessary so that transmitter 70 is compatible with battery powered operation. But the sampling rate used for predistorter 146 is desirably greater than the sampling rates that process the communication signal upstream of predistorter 146 because predistorter 146 will expand the bandwidth of the baseband communication signal to roughly that of bandwidth 52 (FIG. 4).

Figure 20:
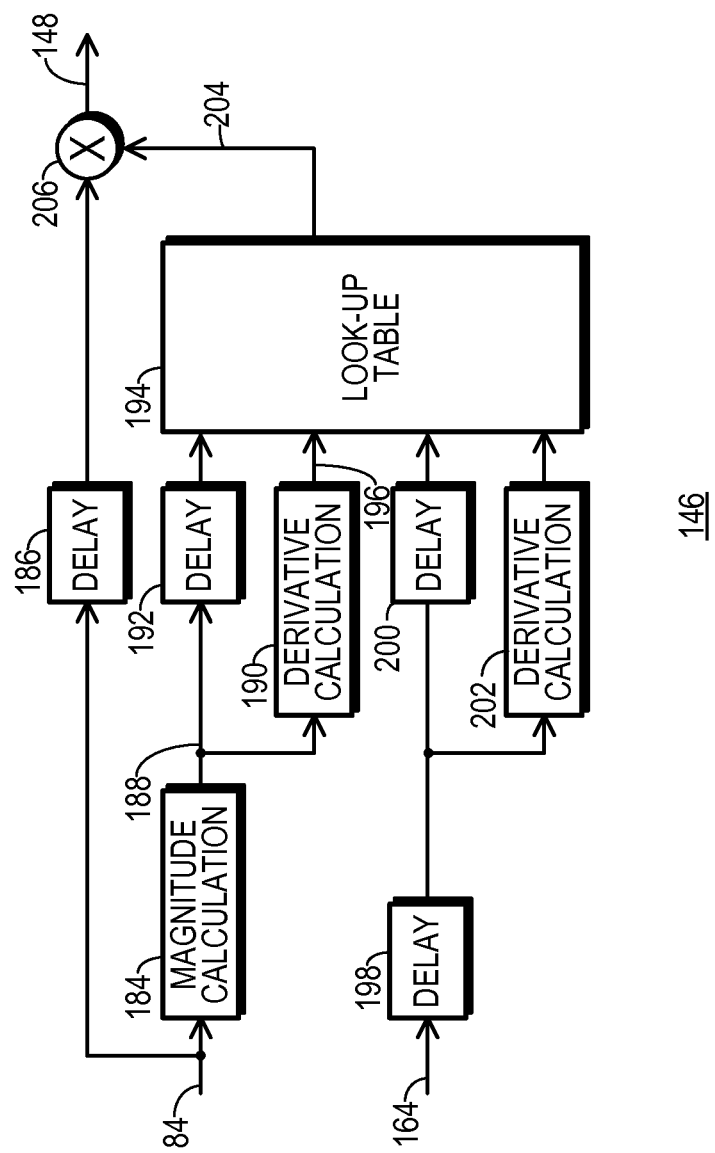
FIG. 20 shows a simplified block diagram of one embodiment of a predistorter portion of the transmitter of FIG. 7.

One example of a predistorter 146 that may be suitable for use in transmitter 70 is described in the above-discussed U.S. Patent Pub. No. 2012/0106676 A1, which is incorporated by reference herein. FIG. 20 shows a simplified block diagram of a predistorter 146 configured in accordance with the teaching of U.S. Patent Pub. No. 2012/0106676 A1, but this specific embodiment is not a requirement in transmitter 70.

As shown in FIG. 20, complex, peak-reduced, baseband communication signal 84 drives a magnitude calculation section 184 and a delay element 186. Magnitude calculation section 184 extracts magnitude from complex signal 84 to generate a magnitude signal 188 that drives a derivative calculation section 190 and a delay element 192. Outputs of delay element 192 and derivative calculation section 190 couple to address inputs of a look-up table 194. Delay element 192 delays magnitude signal 188 into synchronism with a magnitude derivative signal 196 generated by section 190 at the address inputs of look-up table 194.

Bias control signal 164, which is directly derived from shallower-trough envelope tracking signal 96, is correlated with a different cause of distortion 50 (FIG. 4). As discussed above, biasing signal 154 (FIG. 7) is a time varying signal that tracks bias control signal 164. And, biasing signal 154 intermodulates with the fundamental RF communication signal 152 to cause some of distortion 50. To compensate for this form of distortion, bias control signal 164 is delayed in a delay element 198, then applied through another delay element 200 to a separate address input of look-up table 194. In addition, bias control signal 164, after delay in delay element 198, drives a derivative calculation section 202. An output of derivative calculation section 202 couples to another address input of look-up table 194. Delay elements 198 and 200 delay bias control signal 164 into synchronism with magnitude signal 188 and magnitude derivative signal 196 at the address inputs of look-up table 194 and delay the derivative of bias control signal 164 into synchronism as well. Based on the four magnitude signal 188, magnitude derivative signal 196, bias control signal 164 and bias control signal derivative inputs to look-up table 194, look-up table 194 determines, on a sample by sample basis, a gain factor 204 by which peak-reduced communication signal 84 should be scaled to appropriately predistort it so that RF power amplifier 10 will apply an inverse distortion 50 (FIG. 4) and cause amplified RF communication signal 71 (FIG. 7) to appear as having been more nearly linearly amplified. Thus, gain factor 204 drives a first input of a scaling section 206, and peak-reduced communication signal 84, after being delayed in delay element 186, drives a second input of scaling section 206. Delay element 186 delays peak-reduced communication signal 84 into synchronism with gain factor 204. Scaling section 206 provides predistorted, baseband communication signal 148.

Although not shown, additional circuits may be provided which are responsive to peak-reduced communication signal 84 and to amplified RF communication signal 71 and which cause look-up table 194 to continuously adapt itself toward improving its ability to compensate for nonlinearity of RF power amplifier 10. U.S. Patent Pub. No. 2012/0106676 A1 discusses such adaptation circuits in more detail.

Figure 21:
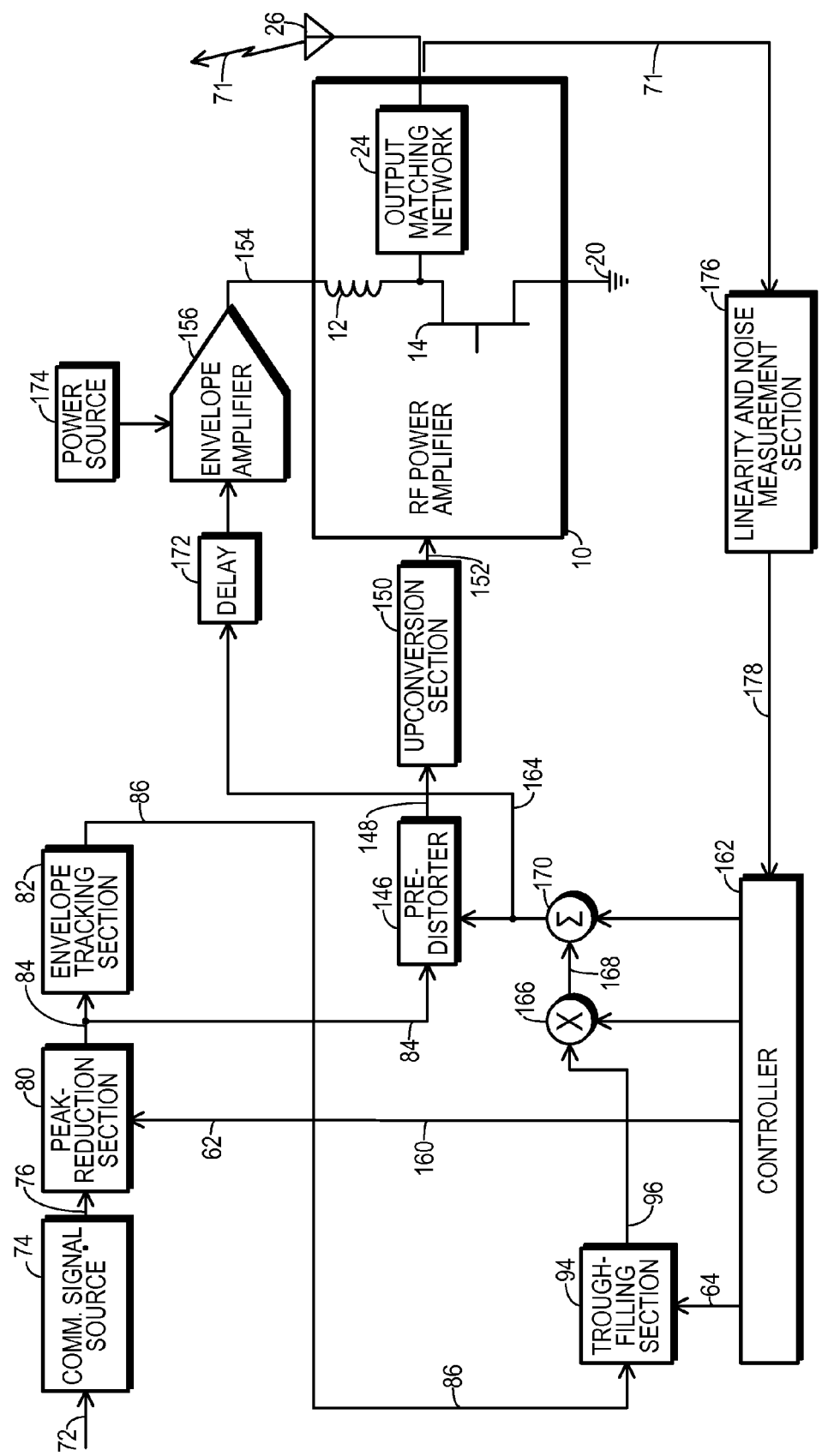
FIG. 21 shows an alternate embodiment to the simplified block diagram of FIG. 7.

FIG. 21 shows an alternate embodiment for transmitter 70 from the embodiment depicted in FIG. 7. The FIG. 21 embodiment differs from the FIG. 7 embodiment in that peak-reduction section 80 is now located upstream of envelope tracking section 82. As discussed above in connection with FIG. 7, peak-reduced baseband communication signal 84 drives an input of predistorter 146. In this FIG. 21 embodiment, peak-reduced communication signal 84 also drives an input to envelope tracking section 82. And, in this FIG. 21 embodiment, scaling section 158 (FIG. 7) has been removed so that control signal 160 generated by controller 162 directly establishes peak-identifying threshold 62 used by peak-reduction section 80 to identify peaks 66 (FIGS. 5-6). Controller 162 may, for example, implement a control loop that causes peak-identifying threshold 62 to adapt to a level that causes amplified RF communication signal 71 exhibit a predetermined EVM. Otherwise, the embodiment of FIG. 21 remains substantially as discussed above in connection with FIG. 7, with each of peak-reduction section 80, envelope tracking section 82, trough-filling section 94, predistorter 146, and the other sections performing substantially the same processes that were discussed above in connection with FIG. 7.

The FIG. 21 embodiment of transmitter 70 allows envelope tracking and trough filling processes to be performed on peak-reduced communication signal 84. While peak-reduction primarily alters peaks, it may in some embodiments include filtering which has an influence which extends in time beyond such peaks 66 (FIGS. 5-6) and may also influence some troughs 68 (FIGS. 5-6). The FIG. 21 embodiment better accommodates such influences.

While FIG. 21 depicts one alternate embodiment, those skilled in the art will appreciate that still other embodiments may be beneficial for other applications. For example, envelope tracking section 82 and trough-filling section 94 may, in some applications, be located downstream of predistorter 146. And, for an EER implementation or an ET implementation that attempts to very closely follow the envelope of amplified RF communication signal 71, bandwidth reduction section 92 (FIG. 7) may be omitted, and trough-filling section 94 may be moved downstream of predistorter 146. In this embodiment the envelope tracking signals are responsive to both the peak-reduced version and the predistorted version of the baseband communication signal. For the EER implementation, a limiter may be added downstream of predistorter 146 and trough-filling section 94 to eliminate the envelope prior to upconversion and to application at the gate of RF amplifying device 14. These and other modifications are intended to be included within the scope of the present invention.

In summary, at least one embodiment of the present invention provides a linearized transmitter with a linear RF power amplifier biased using an ET, EER, or hybrid biasing technique. In at least one embodiment of the present invention a method for operating such a transmitter is provided. In at least one embodiment, a detroughed biasing signal is provided to the RF power amplifier to prevent gain collapse in an RF amplifying device at the core of the RF power amplifier. In at least one embodiment, the biasing signal is detroughed in a manner that prevents bandwidth expansion. In at least one embodiment, the bandwidth of the biasing signal provided to the RF power amplifier is held within the video zone of the electromagnetic spectrum. In at least one embodiment, the biasing signal is provided to a digital predistorter. And, in at least one embodiment, due to bandwidth control of the biasing signal, predistortion is applied in a manner that is effective in compensating for RF power amplifier distortion caused by the use of a time-varying biasing signal.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams, signal charts, and the like may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions. These and other equivalent modifications and adaptations are included within the scope of the present invention.

What is claimed is:

1. A method of operating an RF transmitter utilizing a linear, envelope-tracking, RF power amplifier having an output which receives a biasing signal and having an input, said method comprising:
    forming a deeper-trough envelope tracking signal for a baseband communication signal, said deeper-trough envelope tracking signal exhibiting peaks and troughs wherein at least a portion of said troughs are deeper than corresponding troughs in a shallower-trough envelope tracking signal;
    forming a trough-filling signal from said deeper-trough envelope tracking signal, said trough-filling signal being configured to isolate said portion of said troughs;
    combining said trough-filling signal with said deeper-trough envelope tracking signal to detrough said deeper-trough envelope tracking signal and form said shallower-trough envelope tracking signal;
    biasing said output of said RF power amplifier in response to said shallower-trough envelope tracking signal; and
    driving said input of said RF power amplifier with an RF communication signal formed in response to said baseband communication signal.

2. The method of claim 1 wherein:
    said RF power amplifier is configured to generate an amplified RF communication signal at a power level wherein a substantial portion of said power level is confined within a predetermined bandwidth allocated to said RF transmitter; and
    said baseband communication signal is a digital, complex signal modulated to convey user data and configured to exhibit a bandwidth less than or equal to said predetermined bandwidth.

3. The method of claim 2 wherein:
    said method additionally comprises extracting a magnitude signal from said baseband communication signal, said magnitude signal exhibiting a bandwidth greater than said bandwidth of said baseband communication signal; and
    said deeper-trough envelope tracking signal is formed by processing said magnitude signal to reduce said bandwidth of said magnitude signal.

4. The method of claim 1 wherein:
    said combining step adds distortion to said deeper-trough envelope tracking signal; and
    said method additionally comprises configuring said trough-filling envelope tracking signal to minimize said distortion added to said deeper-trough envelope tracking signal while causing said RF transmitter to transmit an amplified RF communication signal only within a predetermined frequency range.

5. The method of claim 1 wherein:
said deeper-trough envelope tracking signal is formed to exhibit a predetermined bandwidth; and
said trough-filling signal is configured to exhibit a bandwidth no greater than said predetermined bandwidth.

6. The method of claim 1 wherein:
said method additionally comprises applying a peak-reduction process to said baseband communication signal to produce a peak-reduced, baseband communication signal, said peak-reduction process being configured to reduce a peak-to-average power ratio of said baseband communication signal; and
said driving step drives said input of said RF power amplifier in response to said peak-reduced, baseband communication signal.

7. The method of claim 6 wherein said deeper-trough envelope tracking signal is responsive to said peak-reduced, baseband communication signal.

8. The method of claim 1 wherein said deeper-trough envelope tracking signal exhibits a first bandwidth and exhibits peaks in addition to said troughs, and wherein said method additionally comprises:
generating a raw troughing signal in response to said deeper-trough envelope tracking signal, said raw troughing signal being responsive to said troughs, being unresponsive to said peaks, and exhibiting a second bandwidth greater than said first bandwidth; and
filtering said raw troughing signal to form said trough-filling signal which exhibits a bandwidth less than said second bandwidth.

9. The method of claim 8 wherein:
said troughs exhibit minimum amplitudes which are less than a trough-identifying threshold by troughing amounts;
portions of said trough-filling signal exhibit amplitudes substantially equal to zero; and
said filtering step comprises scaling said trough-filling signal so that extremes of said trough-filling signal exhibit amplitudes having absolute values substantially equal to said troughing amounts.

10. The method of claim 1 wherein said trough-filling signal is responsive to a trough-identifying threshold, is responsive to portions of said deeper-trough envelope tracking signal having amplitudes less than said trough-identifying threshold, and is unresponsive to portions of said deeper-trough envelope tracking signal having amplitudes greater than said trough-identifying threshold.

11. The method of claim 10 wherein:
said RF power amplifier is configured to generate an amplified RF communication signal;
said RF transmitter transmits a greater portion of said amplified RF communication signal within an in-band portion of an electromagnetic spectrum and transmits a lesser portion of said RF communication signal within an out-of-band portion of said electromagnetic spectrum; and
said method additionally comprises adjusting said trough-identifying threshold to maintain said portion of said RF communication signal transmitted within said out-of-band portion of said electromagnetic spectrum at a substantially constant predetermined level which complies with a spectral mask.

12. The method of claim 10 additionally comprising continuously adjusting said trough-identifying threshold to maximize power added efficiency of said RF power amplifier while operating said RF transmitter within limits imposed by a spectral mask.

13. The method of claim 1 wherein said combining step maintains a bandwidth of said shallower-trough envelope tracking signal substantially equal to a bandwidth of said deeper-trough envelope tracking signal.

14. The method of claim 1 additionally comprising:
extracting a magnitude signal from said baseband communication signal;
applying linearizing predistortion to said to said baseband communication signal to form a predistorted baseband communication signal, said linearizing predistortion being applied through a look-up table having a first input driven by said magnitude signal and a second input driven by said shallower-trough envelope tracking signal; and
wherein said RF signal which drives said input of said RF power amplifier is formed in response to said predistorted baseband communication signal.

15. The method of claim 14 wherein:
said look-up table has a third input driven by a derivative of said magnitude signal; and
said look-up table has a fourth input driven by a derivative of said shallower-trough envelope tracking signal.

16. An RF transmitter with a linear, envelope-tracking RF power amplifier having an output which receives a biasing signal and having an input, said RF transmitter comprising:
a communication signal source configured to generate a baseband communication signal;
an envelope tracking section responsive to said baseband communication signal and configured to form a deeper-trough envelope tracking signal which tracks an envelope of an RF communication signal generated from said baseband communication signal, said deeper-trough envelope tracking signal exhibiting peaks and troughs wherein at least a portion of said troughs are deeper than corresponding troughs in a shallower-trough envelope tracking signal;
a trough-filling section coupled to said envelope tracking section and configured to form a trough-filling signal from said deeper-trough envelope tracking signal, said trough-filling section being further configured to isolate said portion of said troughs and to combine said trough-filling signal with said deeper-trough envelope tracking signal to detrough said deeper-trough envelope tracking signal and to form said shallower-trough envelope tracking signal;
an envelope amplifier configured to receive said shallower-trough envelope tracking signal and amplify said shallower-trough envelope tracking signal into said biasing signal; and
an upconversion section having an input responsive to said baseband communication signal and being configured to generate said RF communication signal, wherein said RF communication signal drives said input of said RF power amplifier.

17. The RF transmitter of claim 16 wherein:
said envelope tracking section forms said deeper-trough envelope tracking signal to exhibit a predetermined bandwidth; and
said trough-filling section is configured so that said trough-filling signal exhibits a bandwidth no greater than said predetermined bandwidth.

18. The RF transmitter of claim 16 wherein:
said RF transmitter additionally comprises a peak-reduction section responsive to said baseband communication signal and configured to produce a peak-reduced, baseband communication signal which exhibits a reduced peak-to-average power ratio compared to said baseband communication signal; and said upconversion section is responsive to said peak-reduced, baseband communication signal.

19. The RF transmitter of claim 18 wherein:

said peak-reduction section has an input coupled to said communication signal source and an output coupled to said envelope tracking section; and said envelope tracking section is configured so that said deeper-trough envelope tracking signal is responsive to said peak-reduced, baseband communication signal.

20. The RF transmitter of claim 16 wherein:

said deeper-trough envelope tracking signal exhibits a first bandwidth and exhibits peaks in addition to said troughs; and said trough-filling section is configured to generate a raw troughing signal in response to said deeper-trough envelope tracking signal, said raw troughing signal being responsive to said troughs, being unresponsive to said peaks, and exhibiting a second bandwidth greater than said first bandwidth, and said trough-filling section being configured to filter said raw troughing signal to form said trough-filling signal, wherein said trough-filling signal exhibits a bandwidth less than said second bandwidth.

21. The RF transmitter of claim 20 wherein:

said troughs exhibit minimum amplitudes which are less than a trough-identifying threshold by troughing amounts;

said trough-filling section is configured so that portions of said trough-filling signal exhibit amplitudes substantially equal to zero; and said trough-filling section is further configured to scale said trough-filling signal so that extremes of said trough-filling signal exhibit amplitudes having absolute values substantially equal to said troughing amounts.

22. The RF transmitter of claim 16 wherein said trough-filling section is configured so that said trough-filling signal is responsive to a trough-identifying threshold, is responsive to portions of said deeper-trough envelope tracking signal having amplitudes less than said trough-identifying threshold, and is unresponsive to portions of said deeper-trough envelope tracking signal having amplitudes greater than said trough-identifying threshold.

23. The RF transmitter of claim 22 wherein:

said RF power amplifier is configured to generate an amplified RF communication signal;

said RF transmitter transmits a greater portion of said amplified RF communication signal within an in-band portion of an electromagnetic spectrum and transmits a lesser portion of said RF communication signal within an out-of-band portion of said electromagnetic spectrum; and said RF transmitter additionally comprises a controller which monitors said amplified RF communication signal and, in response to said amplified RF communication signal, adjusts said trough-identifying threshold to maintain said portion of said RF communication signal transmitted within said out-of-band portion of said electromagnetic spectrum at a substantially constant predetermined level which complies with a spectral mask.

24. The RF transmitter of claim 16 wherein said trough-filling section is configured so that said shallower-trough envelope tracking signal maintains a bandwidth substantially equal to a bandwidth of said deeper-trough envelope tracking signal.

25. The RF transmitter of claim 16 wherein:

said RF transmitter additionally comprises a predistorter having an input coupled to said communication signal source, said predistorter being configured to extract a magnitude signal from said baseband communication signal, to apply linearizing predistortion to said baseband communication signal, and to form a predistorted baseband communication signal;

said linearizing predistortion is applied through gain adjustment values obtained from a look-up table having a first table input driven by said magnitude signal and a second table input driven by said shallower-trough envelope tracking signal; and said upconversion section is responsive to said predistorted baseband communication signal.

26. The RF transmitter of claim 25 wherein:

said look-up table has a third table input responsive to a derivative of said magnitude signal; and said predistorter has a fourth input responsive to a derivative of said shallower-trough envelope tracking signal.

27. A method of operating an RF transmitter utilizing a linear, envelope-tracking, RF power amplifier having an output which receives a biasing signal and having an input, said method comprising:

extracting a magnitude signal from a complex baseband communication signal, said magnitude signal having a predetermined bandwidth;

converting said magnitude signal into an envelope tracking signal having a bandwidth no greater than said predetermined bandwidth;

detroughing said envelope tracking signal to form a detroughed envelope tracking signal configured to exhibit a bandwidth no greater than said predetermined bandwidth;

applying linearizing predistortion to said to said baseband communication signal to form a predistorted baseband communication signal, said linearizing predistortion being applied through a look-up table having a first input driven by said magnitude signal and a second input driven by said detroughed envelope tracking signal;

biasing said output of said RF power amplifier in response to said detroughed envelope tracking signal; and driving said input of said RF power amplifier with an RF communication signal formed in response to said predistorted baseband communication signal.

28. The method of claim 27 wherein:

said look-up table has a third input driven by a derivative of said magnitude signal; and said look-up table has a fourth input driven by a derivative of said shallower-trough envelope tracking signal.

* * * * *